(12) United States Patent
Kim et al.

(10) Patent No.: US 12,069,914 B2
(45) Date of Patent: Aug. 20, 2024

(54) ORGANIC LIGHT EMITTING DIODE DISPLAY DEVICE AND MANUFACTURING METHOD THEREOF

(71) Applicant: Samsung Display Co., Ltd., Yongin-si (KR)

(72) Inventors: Sung Hwan Kim, Yongin-si (KR); Won Kyu Kwak, Seongnam-si (KR); Sang Moo Choi, Yongin-si (KR); Ji-Hyun Ka, Seongnam-si (KR); Chul Kyu Kang, Suwon-si (KR); Dong Wook Kim, Asan-si (KR); Won Se Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 373 days.

(21) Appl. No.: 17/532,253

(22) Filed: Nov. 22, 2021

(65) Prior Publication Data
US 2022/0085136 A1 Mar. 17, 2022

Related U.S. Application Data

(62) Division of application No. 16/433,182, filed on Jun. 6, 2019, now Pat. No. 11,195,896.

(30) Foreign Application Priority Data

Jun. 7, 2018 (KR) .................. 10-2018-0065631

(51) Int. Cl.
*H01L 27/12* (2006.01)
*H10K 59/121* (2023.01)
(Continued)

(52) U.S. Cl.
CPC ....... *H10K 59/131* (2023.02); *H01L 27/1222* (2013.01); *H01L 27/124* (2013.01); *H10K 59/121* (2023.02); *H10K 71/00* (2023.02)

(58) Field of Classification Search
CPC .............. H10K 59/131; H10K 59/121; H01L 27/1222; H01L 27/124
See application file for complete search history.

(56) References Cited

U.S. PATENT DOCUMENTS 7,122,835 B1 10/2006 Ikeda et al.
7,456,430 B1 11/2008 Yamazaki et al.
(Continued)

FOREIGN PATENT DOCUMENTS

CN 104143562 11/2014
CN 106129061 11/2016
(Continued)

OTHER PUBLICATIONS

US 11,522,041 B2, 12/2022, Kim et al. (withdrawn)
(Continued)

*Primary Examiner* — Eugene Lee
(74) *Attorney, Agent, or Firm* — KILE PARK REED & HOUTTEMAN PLLC

(57) ABSTRACT

An organic light emitting diode display includes a substrate, a semiconductor layer on the substrate, the semiconductor layer including a doped area and an undoped area, a first insulation layer that covers the semiconductor layer, a first conductor on the first insulation layer, a second insulation layer that covers the first conductor, a second conductor on the second insulation layer, a third insulation layer that covers the second conductor, and a third conductor on the third insulation layer, wherein, in the semiconductor layer that overlaps the first conductor, the doped area is between undoped areas.

20 Claims, 21 Drawing Sheets

(51) Int. Cl.
*H10K 59/131* (2023.01)
*H10K 71/00* (2023.01)

(56) References Cited

U.S. PATENT DOCUMENTS

| | | | |
|---|---|---|---|
| 7,575,961 | B2 | 8/2009 | Ikeda et al. |
| 7,855,380 | B2 | 12/2010 | Yamazaki et al. |
| 8,071,981 | B2 | 12/2011 | Yamazaki et al. |
| 8,124,974 | B2 | 2/2012 | Noda et al. |
| 8,129,721 | B2 | 3/2012 | Yamazaki et al. |
| 8,866,143 | B2 | 10/2014 | Yamazaki et al. |
| 8,896,044 | B1 | 11/2014 | Byun |
| 9,390,655 | B2 | 7/2016 | Jeong et al. |
| 9,627,465 | B2 | 4/2017 | Kwon et al. |
| 9,818,765 | B2 | 11/2017 | Osawa et al. |
| 10,050,097 | B2 | 8/2018 | Oh et al. |
| 10,204,976 | B2 | 2/2019 | Kim et al. |
| 10,483,342 | B2 | 11/2019 | Kim et al. |
| 10,559,645 | B2 | 2/2020 | Kwon et al. |
| 10,734,470 | B2 | 8/2020 | Kim et al. |
| 10,985,234 | B2 | 4/2021 | Kim et al. |
| 11,574,988 | B2 | 2/2023 | Kim et al. |
| 11,574,989 | B2 | 2/2023 | Kim et al. |
| 11,574,990 | B2 | 2/2023 | Kim et al. |
| 11,574,991 | B2 | 2/2023 | Kim et al. |
| 2015/0123084 | A1 | 5/2015 | Kim et al. |
| 2016/0087022 | A1 | 3/2016 | Tsai et al. |
| 2016/0104757 | A1 | 4/2016 | Kim et al. |
| 2016/0118452 | A1 | 4/2016 | Pyon |
| 2016/0133190 | A1 | 5/2016 | Kim et al. |
| 2016/0225836 | A1 | 8/2016 | Choi et al. |
| 2016/0254277 | A1* | 9/2016 | Arao ............... G02F 1/1339 257/72 |
| 2016/0254496 | A1 | 9/2016 | Xu et al. |
| 2016/0329391 | A1 | 11/2016 | Ko et al. |
| 2017/0047390 | A1 | 2/2017 | Lee et al. |
| 2017/0061883 | A1 | 3/2017 | Lee et al. |
| 2017/0062544 | A1 | 3/2017 | Kang |
| 2017/0154940 | A1* | 6/2017 | Yamazaki ......... H10K 59/1213 |
| 2017/0213853 | A1* | 7/2017 | Kadono ............ H01L 27/1274 |
| 2017/0358262 | A1 | 12/2017 | Moon |
| 2018/0062105 | A1 | 3/2018 | Lius et al. |
| 2018/0151650 | A1 | 5/2018 | Ha |
| 2018/0158987 | A1 | 6/2018 | Lee et al. |
| 2018/0284508 | A1 | 10/2018 | Hsieh et al. |
| 2020/0176548 | A1 | 6/2020 | Kwon et al. |
| 2023/0024556 | A1 | 1/2023 | Ko et al. |

FOREIGN PATENT DOCUMENTS

| | | |
|---|---|---|
| JP | 2000-353811 | 12/2000 |
| JP | 2006-154495 | 6/2006 |
| JP | 2010-039229 | 2/2010 |
| JP | 2013-128119 | 6/2013 |
| JP | 2014-032379 | 2/2014 |
| KR | 10-0503581 | 7/2005 |
| KR | 10-2016-0105956 | 9/2016 |
| KR | 10-2017-0038594 | 4/2017 |
| KR | 10-2017-0049705 | 5/2017 |
| KR | 10-1739499 | 5/2017 |
| KR | 10-2018-0003747 | 1/2018 |

OTHER PUBLICATIONS

Extended European Search report corresponding to European Patent Application No. 19178873.6. dated Oct. 24, 2019.
Chinese Office Action for Chinese Patent Application No. 201910491292.6, dated Jan. 5, 2024.

* cited by examiner

FIG. 17

| 11 | SPC | PI | |
|---|---|---|---|
| 10 | PDL | PI | |
| 9 | PXL | ITO/Ag | |
| 8 | insulator | PI | ~180 |
| 7 | conductor | Ti/Al/Ti | ~171,172,73 |
| 6 | insulator | $SiN_X/SiO_X$ | ~160  w/opening 62,67,68,69 |
| 5 | gate conductor | Mo | ~126 |
| | gate insulator | $SiN_X$ | ~142 |
| 4 | gate conductor | Mo | ~151,152,153,155,157 |
| 3 | gate insulator | $SiO_2$ | ~141 |
| 2 | PBLK | photoresist | |
| 1 | semiconoluctor layer | p-Si | ~PS |
| | Buffer | $SiO_2/SiN_X$ | ~112 |

ORGANIC LIGHT EMITTING DIODE DISPLAY DEVICE AND MANUFACTURING METHOD THEREOF

CROSS-REFERENCE TO RELATED APPLICATION(S)

This is a divisional application of U.S. patent application Ser. No. 16/433,182, filed Jun. 6, 2019, now U.S. Pat. No. 11,195,896 issued Dec. 7, 2021, the disclosure of which is incorporated herein by reference in its entirety. U.S. patent application Ser. No. 16/433,182 claims priority to and benefit of Korean Patent Application No. 10-2018-0065631 under 35 U.S.C. § 119, filed on Jun. 7, 2018, in the Korean Intellectual Property Office, the entire contents of which are incorporated herein by reference.

BACKGROUND

1. Field

The present disclosure relates to an organic light emitting diode display and manufacturing method thereof.

2. Description of the Related Art

A display device is a device displaying an image, and recently, an organic light emitting diode display has received attention. Since the organic light emitting diode display has a self-emission characteristic and does not require a separate light source, unlike a liquid crystal display device, it is possible to reduce the thickness and weight thereof. Further, the organic light emitting diode display has high-quality characteristics such as low power consumption, high luminance, and high response speed.

SUMMARY

An organic light emitting diode display according to an exemplary embodiment may include a substrate, a semiconductor layer that is disposed on the substrate, a first insulation layer that covers the semiconductor layer, a first conductor that is disposed on the first insulation layer, a second insulation layer that covers the first conductor, a second conductor that is disposed on the second insulation layer; a third insulation layer that covers the second conductor, and a third conductor that is disposed on the third insulation layer, wherein the semiconductor layer includes a doped area and an undoped area, and in the semiconductor layer that overlaps the first conductor, the doped area is disposed between two undoped areas.

Channels of a (4-1)th transistor and a (4-2)th transistor may be respectively disposed in the undoped areas that are disposed at opposite sides of the doped area, and one electrode of the (4-1)th transistor and one electrode of the (4-2)th transistor may be disposed in the doped area.

A first electrode of the (4-2)th transistor and a second electrode of the (4-1)th transistor may be disposed in the doped area.

The semiconductor layer that includes the undoped areas and the doped area that is disposed between the undoped areas may have a straight-line structure that extends in one direction.

The first conductor may include a previous scan line, and the previous scan line may include an expansion area that covers the doped area and the undoped area.

The semiconductor layer may further include an expansion portion, the first insulation layer may include an opening that exposes the expansion portion, and the first conductor may be directly connected with the expansion portion through the opening.

The first conductor may be a gate electrode of a driving transistor.

The second conductor may include a sustain line that includes an expanded portion, and the gate electrode of the driving transistor may form a storage capacitor together with the expanded portion of the sustain line, which overlaps the gate electrode of the driving transistor, and the second insulation layer that is disposed between the gate electrode of the driving transistor and the expanded portion of the sustain line.

The sustain line may be applied with a driving voltage.

The third conductor may include a driving voltage line that includes an expansion portion, and the expansion portion of the driving voltage line may be directly connected with the sustain line through an opening formed in the third insulation layer The expansion portion of the driving voltage line may cover at least a part of a connection portion of a (3-1)th transistor and a (3-2)th transistor that are connected in series.

The connection portion may be disposed in the semiconductor layer.

The first conductor may further include a scan line, the semiconductor layer may have a structure in which the semiconductor layer is passed through a channel of the (3-2)th transistor and then bent to the left while extending upward, and then bent downward and passes through a channel of the (3-1)th transistor, and the scan line may overlap the channel of the (3-2)th transistor and the channel of the (3-1)th transistor.

The expansion portion of the semiconductor layer may be disposed after passing through the channel of the (3-1)th transistor.

The semiconductor layer may pass through the channel of the (3-1)th transistor and is then bent to the left, and then may sequentially meet a channel of a (4-1)th transistor and a channel of a (4-2)th transistor while being bent upward again.

The semiconductor layer may further include a second expansion portion, the first insulation layer may include an opening that exposes the second expansion portion, and the first conductor may be directly connected with the second expansion portion through the opening.

The first conductor may be an initialization voltage line.

The first conductor may include a scan line, a previous scan line, and an initialization voltage line, the third conductor includes a data line and a driving voltage line, and one pixel includes an organic light emitting element that emits light, a second transistor that is connected with the scan line and the data line, and a driving transistor that applies a current to the organic light emitting element.

The first conductor may further include a light emission control line, and the pixel may further include a fifth transistor and a sixth transistor that are connected to the light emission control line.

The pixel may further include a (3-1)th transistor and a (3-2)th transistor that are connected in series, and a (4-1)th transistor and a (4-2)th transistor that are connected in series.

A manufacturing method of an organic light emitting diode display according to an exemplary embodiment may including forming a semiconductor layer on a substrate; forming a doping mask on the semiconductor layer and doping the semiconductor layer; removing the doping mask;

forming a first insulation layer covering the semiconductor layer; forming a first conductor on the first insulation layer; doping the semiconductor layer by using the first conductor as a mask; forming a second insulation layer covering the first conductor; forming a second conductor on the second insulation layer; forming a third insulation layer covering the second conductor; forming a third conductor on the third insulation layer; forming a passivation layer covering the third conductor; and forming a pixel electrode on the passivation layer.

The forming the semiconductor layer on a substrate may comprise forming an amorphous silicon layer by using a first mask, and then crystallizing the amorphous silicon layer into a polycrystalline semiconductor.

The forming the doping mask on the semiconductor layer and doping the semiconductor layer may comprise forming the doping mask by using a second mask, and then doping an exposed semiconductor layer with an impurity.

In the removing the doping mask, the doping mask may be removed by using a stripper.

The forming the first insulation layer covering the semiconductor layer may comprise forming openings at the first insulation layer by using a third mask.

In the forming the first conductor on the first insulation layer, the first conductor may be formed by using a fourth mask.

The first conductor may comprise a scan line, a previous scan line, a light emission control line, a initialization voltage line, and a gate electrode.

In the forming the second conductor on the second insulation layer, the second conductor may be formed by using a fifth mask.

The second conductor may comprise a sustain line including an expansion portion which functions as a first storage electrode.

The forming the third insulation layer covering the second conductor may comprise forming openings at the third insulation layer by using a sixth mask.

The openings formed by the sixth mask may comprise an opening also formed in the first insulation layer and the second insulation layer disposed below the third insulation layer.

The opening in the first insulation layer, the second insulation layer, and the third insulation layer may expose a portion of the semiconductor layer, and through the exposed portion of the semiconductor layer, the semiconductor layer may receive a data voltage, or a driving voltage, or may apply a driving current.

The openings formed by the sixth mask may comprise an opening formed only in the third insulation layer, and the opening by the sixth mask may expose an expansion portion of a sustain line which functions as a first storage electrode.

In the forming the third conductor on the third insulation layer, the third conductor may be formed by using a seventh mask.

The third conductor may comprise a data line, a driving voltage line, and a data connection member.

The forming the passivation layer covering the third conductor may comprise forming openings at the passivation layer by using a eighth mask.

The forming the pixel electrode on the passivation layer may comprise forming the pixel electrode by using a ninth mask.

The manufacturing method may further comprise forming a partition wall surrounding the pixel electrode.

The manufacturing method may further comprise before the forming the semiconductor layer on the substrate, forming a buffer layer on the substrate.

The manufacturing method may further comprise before the forming the buffer layer on the substrate, forming a barrier layer on the substrate.

BRIEF DESCRIPTION OF THE DRAWINGS

Features will become apparent to those of skill in the art by describing in detail exemplary embodiments with reference to the attached drawings, in which:

FIG. 17 schematically illustrates a layered relationship of a pixel of an organic light emitting diode display according to an exemplary embodiment.

DETAILED DESCRIPTION

Figure 1:
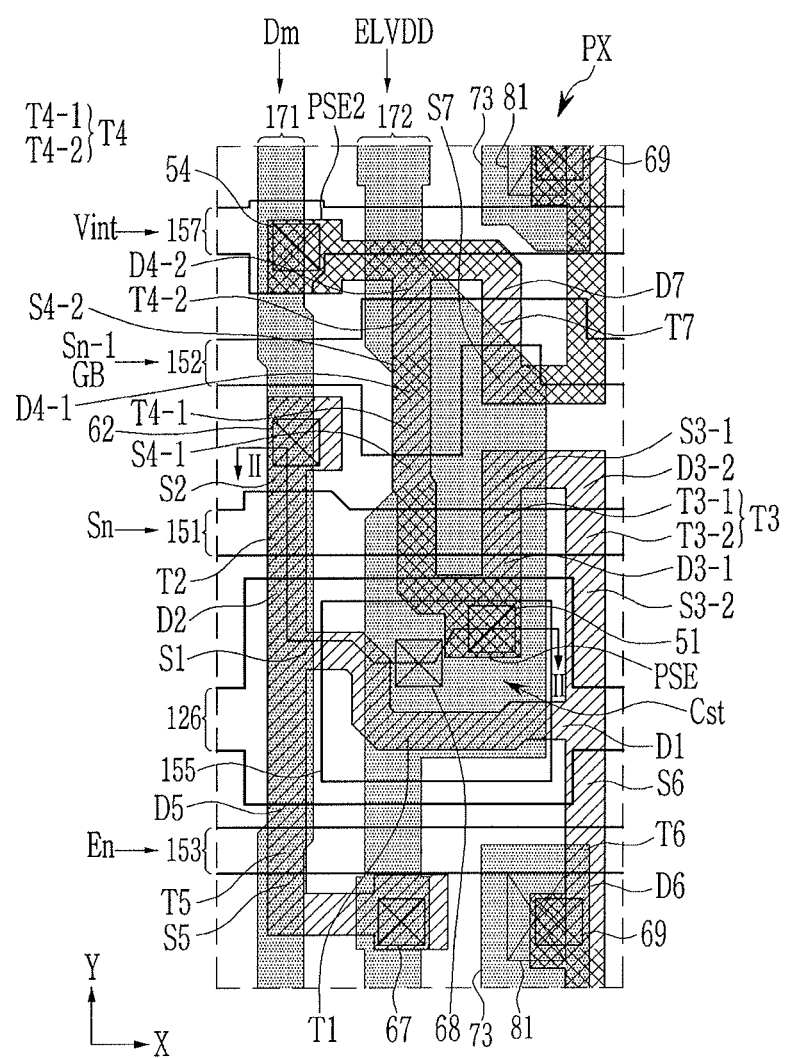
FIG. 1 illustrates a layout view of an organic light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. In contrast, when an element is referred to as being "directly on" another element, there are no intervening elements present. The word "on" or "above" means positioned on or below the object portion, and does not necessarily mean positioned on the upper side of the object portion based on a gravitational direction. Like reference numerals refer to like elements throughout.

In addition, unless explicitly described to the contrary, the word "comprise" and variations such as "comprises" or "comprising" will be understood to imply the inclusion of stated elements but not the exclusion of any other elements. Further, in this specification, the phrase "on a plane" means viewing a target portion from the top, and the phrase "on a cross-section" means viewing a cross-section formed by vertically cutting a target portion from the side.

Hereinafter, a pixel structure of an organic light emitting diode display according to an exemplary embodiment will be described with reference to FIG. 1 and FIG. 2. FIG. 1 is a layout view of an organic light emitting diode display according to an exemplary embodiment, and FIG. 2 is a cross-sectional view of FIG. 1, taken along the line II-II.

Referring to FIG. 1, an organic light emitting diode (OLED) display according to an exemplary embodiment may include scan lines 151, previous scan lines 152, light emission control lines 153, and initialization voltage lines 157 that substantially extend in a first direction X and transmit a scan signal Sn, a previous scan signal Sn-1, a light emission control signal En, and an initialization voltage Vint, respectively. Further, the OLED display includes data lines 171 and driving voltage lines 172 that extend in a second direction Y that crosses the first direction X, and transmit a data voltage Dm and a driving voltage ELVDD, respectively.

Figure 19:
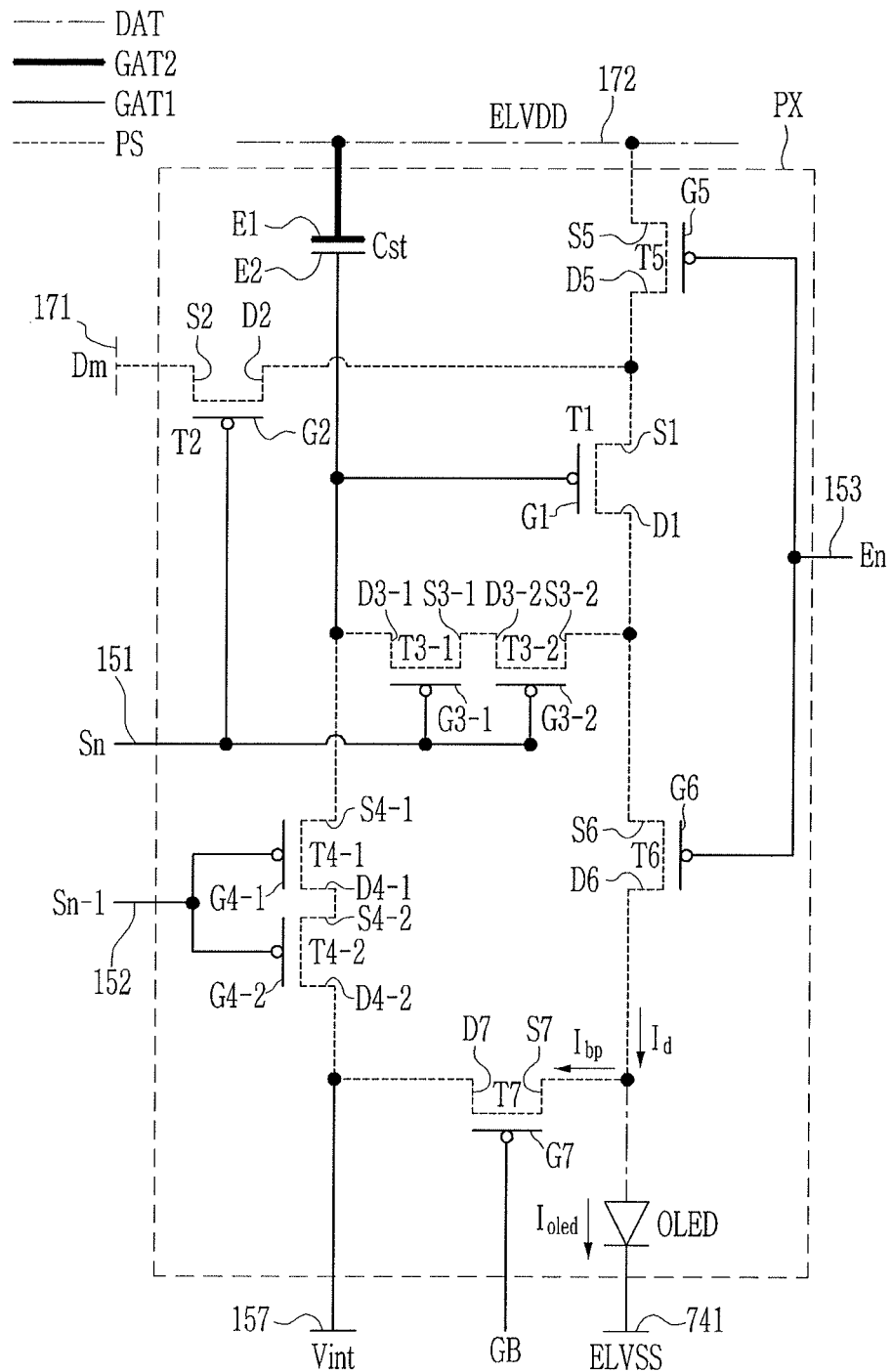
FIG. 19 illustrates an equivalent circuit diagram of a pixel of an organic light emitting diode display according to an exemplary embodiment.

Each pixel of the OLED display includes a driving transistor T1, a second transistor T2, a third transistor T3, a fourth transistor T4, a fifth transistor T5, a sixth transistor T6, a seventh transistor T7, a storage capacitor Cst, and an organic light emitting diode OLED (e.g., FIG. 19). Each of the third transistor T3 and the fourth transistor T4 includes multiple transistors, e.g., the third transistor T3 has a structure including first and second third transistors T3-1 and T3-2, and the fourth transistor T4 has a structure including first and second fourth transistors T4-1 and T4-2, that are connected and simultaneously turned on by the same gate signal such that a signal input to one side transistor is output through the other side transistor. Hereinafter, such a connection structure will be called a serial connection structure.

Figure 2:
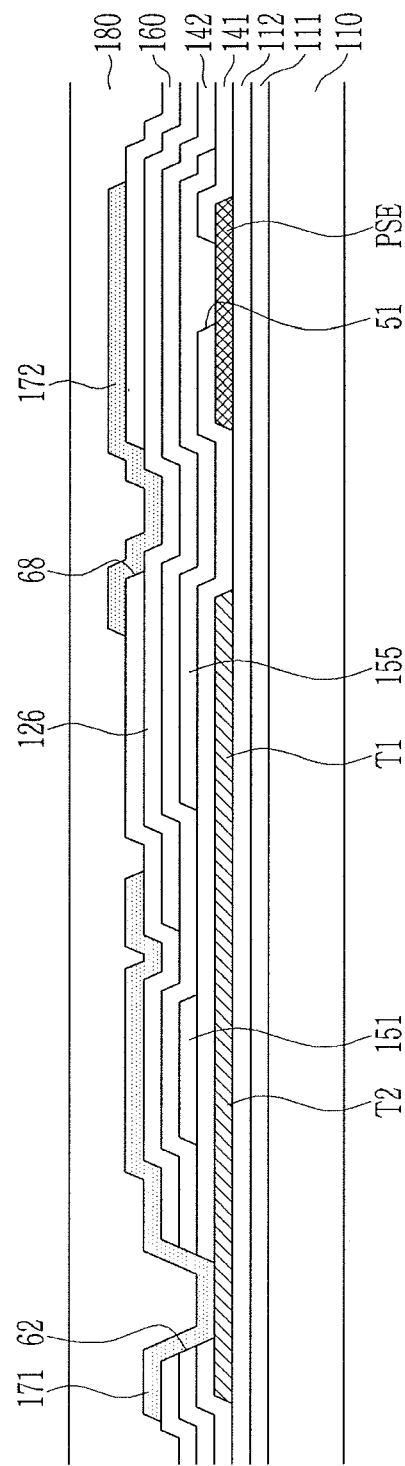
FIG. 2 illustrates a cross-sectional view along line II-II of FIG. 1.

In FIG. 1 and FIG. 2, the organic light emitting diode OLED is not illustrated, and the organic light emitting diode OLED is formed of a pixel electrode, an organic emission layer, and a common electrode. A structure of the organic light emitting diode OLED is formed on the connection structure of the transistors T1 to T7 shown in FIG. 1 and FIG. 2. A connection relationship between transistors (T1 to T7) that apply a current to the organic light emitting diode OLED directly relates to an area occupied by a pixel, and FIG. 1 and FIG. 2 mainly illustrate such a connection relationship.

In the OLED display, a semiconductor layer PS (FIG. 3) is required to form a plurality of transistors T1, T2, T3, T4, T5, T6, and T7, and the semiconductor layer PS is provided as a polycrystalline semiconductor in the present exemplary embodiment. In addition, in the present exemplary embodiment, excluding channels of the plurality of transistors T1, T2, T3, T4, T5, T6, and T7 in the polycrystalline semiconductor, the polycrystalline semiconductor becomes a conductor by doping a P-type impurity such that the polycrystalline semiconductor has a property of a wire. Thus, an additional wiring layer does not need to be formed. Meanwhile, the polycrystalline semiconductor can be doped with an N-type impurity depending on exemplary embodiments, and a semiconductor oxide may be used instead of the polycrystalline semiconductor according to another exemplary embodiment.

Figure 3:
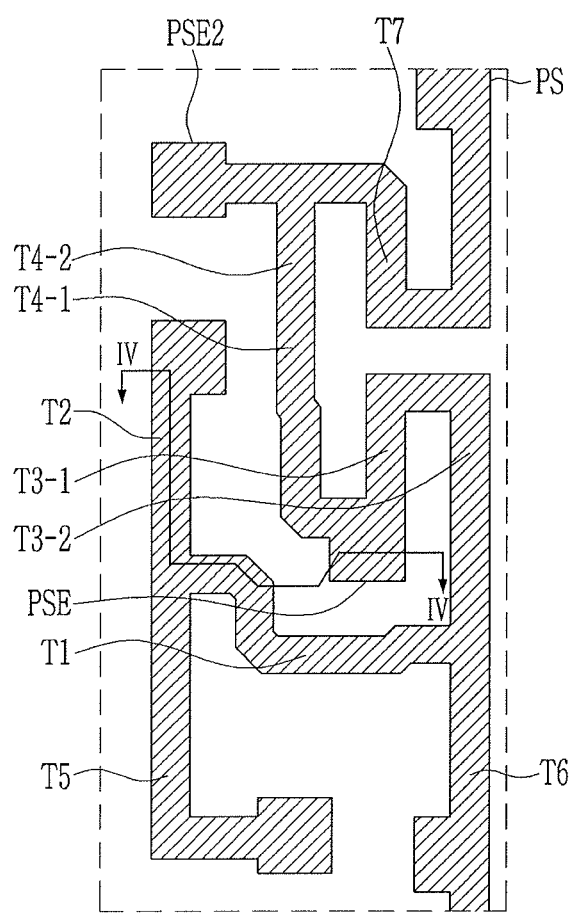
FIG. 3 to FIG. 16 illustrate layout views and cross-sectional views of stages in a method for manufacturing a pixel of an organic light emitting diode display according to an exemplary embodiment.

A structure of the semiconductor layer PS according to the present exemplary embodiment can be easily seen in the layout view of FIG. 3, and is indicated by a hatch pattern portion. The semiconductor layer PS is vertically extended with respect to opposite sides of a channel of the driving transistor T1.

As illustrated in FIG. 1, a first electrode S1 is disposed at the left side, i.e., along the first direction X, of the channel of the driving transistor T1, and a channel of the second transistor T2 is disposed in the semiconductor layer PS that extends upward, i.e., along the second direction Y, from the first electrode S1. Meanwhile, a channel of the fifth transistor T5 is disposed in the semiconductor layer PS that extends downward from the first electrode S, i.e., along the second direction Y. A second electrode D1 is disposed at the right side of the channel of the driving transistor T1, i.e., along the first direction X, and a channel of the sixth transistor T6 is disposed in the semiconductor layer PS that extends downward from the second electrode D1, along the second direction Y.

A semiconductor layer PS of a pixel in the next stage is connected below the channel of the sixth transistor T6. The semiconductor layer PS extends upward from the second electrode D1 and is bent several times, and a channel of the transistor T3-2, a channel of the transistor T3-1, a channel of the transistor T4-1, a channel of the transistor T4-2, and a channel of the seventh transistor T7 are sequentially disposed from the second electrode D1. More specifically, the semiconductor layer PS that has been extended upward from the second electrode D1, i.e., along the second direction Y, is bent left, i.e., along the first direction X, after passing through the channel of the transistor T3-2 and then bent downward, i.e., along the second direction Y, such that it passes through the channel of the transistor T3-1. After passing through the channel of the transistor T3-1, the semiconductor layer PS is bent left again, i.e., along the first direction X, and then bent upward, i.e., along the second direction Y, such that it sequentially meets the channel of the transistor T4-1 and the channel of the transistor T4-2. After sequentially meeting the channel of the transistor T4-1 and the channel of the transistor T4-2, the semiconductor layer PS passes through the channel of the seventh transistor T7 and then is bent right again, i.e., along the first direction X, and then is bent upward, i.e., along the second direction Y, such that it is connected with the semiconductor layer PS of the pixel PX of the previous stage.

In addition, the semiconductor layer PS may include an expansion portion for connection with wiring that is disposed in another layer. The semiconductor layer PS extended upward from the channel of the second transistor T2 includes an expansion portion that is expanded to receive the data voltage Dm. The semiconductor layer PS at a portion that is bent downward from the channel of the fifth transistor T5 and then bent right includes an expansion portion that is expanded to receive a driving voltage ELVDD. The semiconductor layer PS at a portion extended downward from the channel of the sixth transistor T6 includes an expansion portion that is expanded to be connected with a data connection member 73 and to apply a driving current to the organic light emitting diode OLED through a pixel electrode that is disposed thereabove. In addition, the semiconductor layer PS according to the present exemplary embodiment further includes a first expansion portion PSE that is disposed between the channel of the transistor T3-1 and the channel of the transistor T4-1, and the first expansion portion PSE is a portion that is connected with a gate electrode G1. The semiconductor layer PS further includes a second expansion portion PSE2 that extends to the left and is then expanded between the channel of the transistor T4-2 and the channel of the seventh transistor T7, and the second expansion portion PSE2 is a portion expanded to receive the initialization voltage Vint.

Some of such a semiconductor layer PS is heavily doped by a P-type impurity and thus the heavily doped portion has the same characteristic as a conductor. For this purpose, some of the semiconductor layer PS needs to be covered, and the rest is not covered and thus becomes wiring by being doped with the P-type impurity.

In general, a metal layer (e.g., a gate electrode) is formed on the semiconductor layer PS, and then the semiconductor layer PS may be doped while using the metal layer as a mask. However, an additional doping mask PBLK may be used to form all constituent elements in a narrower pixel area such that a doping structure that is different from a structure of the gate electrode may be formed. After a doping by using the additional doping mask PBLK, the semiconductor layer PS may be additionally doped by using the metal layer as a mask.

Figure 5:
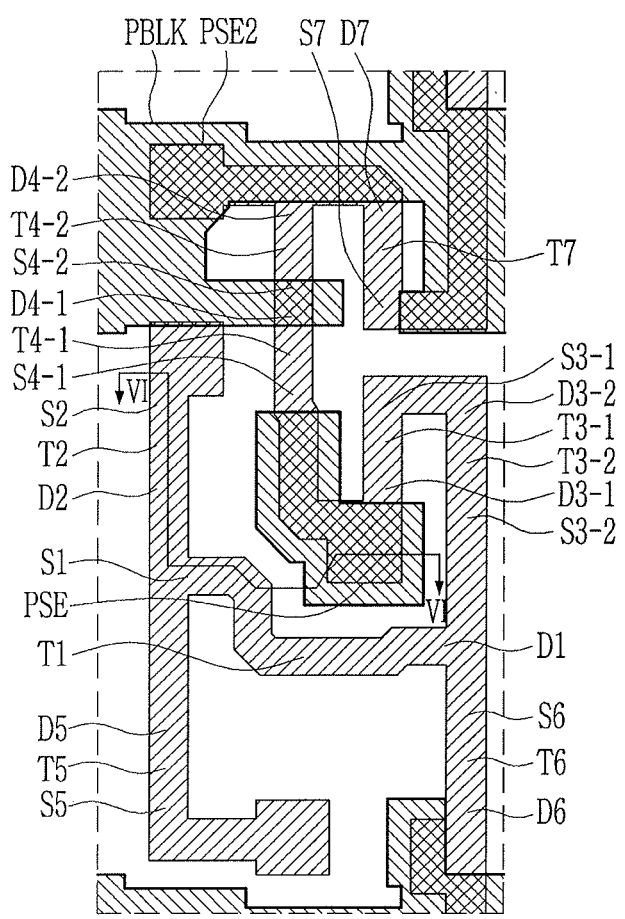

In FIG. 1, the semiconductor layer PS is marked with a hatch pattern, and a portion of the semiconductor layer PS that becomes wiring by being doped is marked with a crosshatch pattern. A structure of a doping mask PBLK is shown in FIG. 5, and FIG. 1 illustrates only the semiconductor layer PS after being doped. In the present exemplary embodiment, a photosensitive material, e.g., a photoresist, is used as the doping mask PBLK, and the doping mask PBLK has a thickness that is sufficient to prevent the P-type impurity from contacting the semiconductor PS. The doping mask PBLK is not illustrated in FIG. 1 since it is removed after a doping process.

In the present exemplary embodiment, the semiconductor layer PS includes five portions that become wiring by being doped with the P-type impurity. In detail, referring to FIG. 1, first, a portion of the semiconductor layer PS, which is disposed between the channel of the transistor T3-1 and the channel of the transistor T4-1 and includes the first expansion portion PSE, is doped. Second, a portion of the semiconductor layer PS, which is disposed between the channel of the transistor T4-1 and the channel of the transistor T4-2 is doped. Third, a portion of the semiconductor layer PS, which is disposed between the channel of the transistor T4-2 and the channel of the seventh transistor T7, and then, e.g., continuously, extends to the left to include the second expansion portion PSE2, is doped. Fourth, a portion of the semiconductor layer PS extended to the previous pixel PX, i.e., along the second direction Y, from the channel of the seventh transistor T7, is doped. Fifth, a portion of the semiconductor layer PS extended to a pixel PX at a next stage from the channel of the sixth transistor T6 is doped.

Referring to FIG. 2, a first insulation layer 141 is disposed on the semiconductor layer PS to cover the semiconductor layer PS. First and second openings 51 and 54 are formed in the first insulation layer 141. The first and second openings 51 and 54 respectively expose the first and second expansion portions PSE and PSE2 of the semiconductor layer PS, as illustrated in FIG. 1.

The scan line 151, the previous scan line 152, the light emission control line 153, and the initialization voltage line 157 that extend in the first direction X and respectively transmit the scan signal Sn, the previous scan signal Sn-1, the light emission control signal En, and the initialization voltage Vint are formed on the first insulation layer 141.

First, the scan line 151 extends in the first direction, and overlaps the channel of the second transistor T2, the channel of the transistor T3-1, and the channel of the transistor T3-2 while extending in the first direction. In addition, the scan line 151 overlaps a doped portion of the semiconductor layer PS, which is between the channel of the transistor T3-1 and the channel of the transistor T4-1. In the present exemplary embodiment, an area that overlaps the channel of the second transistor T2 has a wide width. Transistors are formed in portions of the semiconductor layer PS, which are not doped, that overlap with the scan line 151, so the second transistor T2, the transistor T3-1, and the transistor T3-2 are formed in the overlapped portions.

The previous scan line 152 extends in the first direction, and overlaps the channel of the transistor T4-1, the channel of the transistor T4-2, and the channel of the seventh transistor T7 while extending in the first direction. In addition, the previous scan line 152 overlaps portions of the semiconductor layer PS, which are doped between the channel of the transistor T4-1 and the channel of the transistor T4-2, and also overlaps a doped portion of the semiconductor layer PS, which extends to a pixel at a previous stage from the channel of the seventh transistor T7. In the present exemplary embodiment, the previous scan line 152 includes an expansion area that expands at a portion that overlaps the channel of the transistor T4-1 and the channel of the transistor T4-2, and is bent downward while passing through the channel of the seventh transistor T7. Transistors are formed in portions where the previous scan line 152 and portions of the semiconductor layer PS, which are not doped, overlap each other, and the transistor T4-1, the transistor T4-2, and the seventh transistor T7 are respectively formed in the overlapped portions.

The light emission control line 153 also extends in the first direction, and overlaps the channel of the fifth transistor T5 and the channel of the sixth transistor T6 while extending in the first direction. Transistors are formed in portions where the light emission control line 153 and portions of the semiconductor layer PS, which are not doped, overlap each other, and the fifth transistor T5 and the sixth transistor T6 are respectively formed in the overlapped portions.

The initialization voltage line 157 also extends in the first direction, and only overlaps the doped portions of the semiconductor layer PS, such that no transistor is formed. The initialization voltage line 157 of the present exemplary embodiment has a wide width at a portion of the second expansion portion PSE2 of the semiconductor layer PS, and is directly connected with the second expansion portion PSE2 by the second opening 54. Accordingly, the initialization voltage Vint is applied to the semiconductor layer PS through the second expansion portion PSE2.

Meanwhile, a gate electrode 155 of the driving transistor T1 is also formed on the first insulation layer 141. The gate electrode 155 has a quadrangular structure, and not only overlaps the channel of the driving transistor T1 but also overlaps the first expansion portion PSE of the semiconductor layer PS. Since a transistor is formed in a portion where the gate electrode 155 and an undoped portion of the semiconductor layer PS overlap each other, the driving transistor T1 is formed in the portion. In addition, the gate electrode 155 overlaps the first expansion portion PSE, which is a doped portion of the semiconductor layer PS, and is directly connected with the first expansion portion PSE through the first opening 51. Accordingly, a voltage applied to the gate electrode 155 of the driving transistor T1 is affected by operation of the transistor T3-1 and the transistor T4-1. In addition, the gate electrode 155 of the driving transistor T1 also functions as a second storage electrode of a storage capacitor Cst.

The gate electrode 155 of the driving transistor T1 may be formed of the same materials as the scan line 151, the previous scan line 152, the light emission control line 153, and the initialization voltage line 157, and on the same layer, e.g., as a same height relative to a substrate 110. After forming the scan line 151, the previous scan line 152, the light emission control line 153, and the initialization voltage line 157, the semiconductor layer PS is additionally doped by using those metal layers as a mask. That is, uncovered portions of the semiconductor layer PS by the scan line 151, the previous scan line 152, the light emission control line 153, and the initialization voltage line 157 are doped, and then the uncovered portions of the semiconductor layer PS become a conductor such that the semiconductor has a property of a wire.

The gate electrode 155, the scan line 151, the previous scan line 152, the light emission control line 153, and the initialization voltage line 157 are covered by a second insulation layer 142.

A sustain line 126 is disposed on the second insulation layer 142. The sustain line 126 extends in the first direction, and has an expanded width in the second direction Y at a portion that overlaps the gate electrode 155 (e.g., FIG. 1). The expanded width of the sustain line 126 is formed to wholly cover, e.g., completely overlap a top surface of, the gate electrode 155. The expanded portion of the sustain line 126 overlaps the gate electrode 155 on a plane while disposing the second insulation layer 142 therebetween, such that a storage capacitor Cst is formed. The expanded portion of the sustain line 126 forms, e.g., defines, a first storage electrode of the storage capacitor Cst, and the gate electrode 155 forms, e.g., defines, a second storage electrode of the storage capacitor Cst. The expanded portion of the sustain line 126 has a quadrangular structure, and has no opened portion such that the inside of the quadrangular structure is filled with a metallic material. Accordingly, sufficient capacitance of the storage capacitor Cst can be assured even though an area where the pixel PX is formed is reduced.

A third insulation layer 160 is formed on the sustain line 126. Four openings 62, 67, 68, and 69 are formed in the third insulation layer 160. The opening 62 is disposed above the channel of the second transistor T2 of the semiconductor layer PS, and exposes an expansion portion that is expanded to receive a data voltage Dm. The opening 67 is disposed below the channel of the fifth transistor T5 of the semiconductor layer PS, and exposes an expansion portion that is expanded to receive the driving voltage ELVDD. The opening 69 is disposed below the channel of sixth transistor T6, and exposes an expansion portion that is expanded to apply a driving current to the organic light emitting diode OLED. The opening 68 exposes a part of the expanded portion of the sustain line 126. Accordingly, although the opening 68 is formed only in the third insulation layer 160, the openings 62, 67, and 69 are formed in the first insulation layer 141, the second insulation layer 142, and the third insulation layer 160. The data line 171, the driving voltage line 172, and the data connection member 73 are formed on the third insulation layer 160.

The data line 171 extends in the second direction, and may be partially bent. The data line 171 transmits the data voltage Dm to a first electrode S2 of the second transistor T2 through the opening 62.

The driving voltage line 172 also extends in the second direction, and is partially bent and includes an expansion portion having an expanded width in the first direction X. The expansion portion of the driving voltage line 172 is expanded to cover a part of the driving transistor T1, a part of the transistors T3-1 and T3-2, and part of the transistors T4-1 and T4-2. The expansion portion applies the driving voltage ELVDD to the sustain line 126 through the opening 68 at a portion overlapping the expanded portion of the sustain line 126. Accordingly, the driving voltage ELVDD is applied to the first storage electrode of the storage capacitor Cst. Since the opening 68 needs to be formed only at a portion where the driving voltage line 172 and the expanded portion of the sustain line 126 overlap, the location of the opening 68 can be variously changed at the periphery of the illustrated location instead of being disposed in the illustrated location.

The expansion portion of the driving voltage line 172 covers at least a part of a connection portion of the transistors T3-1 and T3-2 that are connected in series. That is, the connection portion is a portion to which a first electrode S3-1 of the transistor T3-1 and a second electrode D3-2 of the transistor T3-2 are directly connected, and is disposed on the semiconductor layer PS. Since the expansion portion of the driving voltage line 172 covers the connection portion of the transistors T3-1 and T3-2, a voltage of the connection portion can be stabilized. When the voltage of the connection portion of the third transistors T3-1 and T3-2 is stabilized, a characteristic of the driving transistor T1 of each pixel PX can be stabilized. This is because that outputs of the transistors T3-1 and T3-2 and the gate electrode 155 of the driving transistor T1 are electrically connected with each other, and the data voltage Dm is passed through the transistors T3-1 and T3-2 and stored in the storage capacitor Cst. The expansion portion of the driving voltage line 172 partially overlaps the transistors T4-1 and T4-2 and the driving transistor T1, and an overlapped area can be adjusted depending on features of exemplary embodiments. In addition, the driving voltage line 172 applies the driving voltage ELVDD to a first electrode S5 of the fifth transistor T5 through the opening 67, and has a width that is slightly widened at the periphery of the opening 67.

The data connection member 73 is electrically connected with the expansion portion of the semiconductor layer PS, which is disposed below the channel of the sixth transistor T6, through the opening 69. The data connection member 73 transmits a driving current to the organic light emitting diode OLED.

A passivation layer 180 that covers the data line 171, the driving voltage line 172, and the data connection member 73 is formed on the data line 171, the driving voltage line 172, and the data connection member 73. An opening 81 that exposes the data connection member 73 is formed in the passivation layer 180, and the organic light emitting diode OLED is disposed on the passivation layer 180. In addition, a partition wall that partitions the organic light emitting diode OLED is formed on the passivation layer 180. Further, a spacer may be formed to maintain a predetermined gap with a layer that is additionally formed above.

The organic light emitting diode OLED includes a pixel electrode, an organic emission layer, and a common electrode. The pixel electrode is connected with the data connection member 73 through the opening 81.

An encapsulation layer that protects the organic light emitting diode OLED from moisture and the like is formed on the organic light emitting diode OLED, the partition wall, and the spacer. The encapsulation layer may or may not contact the common electrode. The encapsulation layer may be a thin film encapsulation layer formed by stacking an inorganic layer and the organic layer, or may include a triple-stacked layer of an inorganic layer, an organic layer, and an inorganic layer. A capping layer and a functional layer may be disposed between the common electrode and the encapsulation layer.

As described above, seven transistors are formed as the semiconductor layer PS overlaps the gate electrode 155, the scan line 151, the previous scan line 152, the light emission control line 153, the data line 171, and the driving voltage line 172. The seven transistors are as follows. A channel of each of the plurality of transistors T1, T2, T3-1, T3-2, T4-1, T4-2, T5, T6, and T7 overlaps a gate electrode of each of the T1, T2, T3-1, T3-2, T4-1, T4-2, T5, T6, and T7, and is disposed between a first electrode and a second electrode of each of the transistors T1, T2, T3-1, T3-2, T4-1, T4-2, T5, T6, and T7. The plurality of transistors T1, T2, T3-1, T3-2, T4-1, T4-2, T5, T6, and T7 may substantially have equivalent layered structures.

The driving transistor T1 includes a channel, a gate electrode 155, a first electrode S1, and a second electrode D1. The channel of the driving transistor T1 is disposed between the first electrode S1 and the second electrode D2, and overlaps the gate electrode 155 on a plane. The channel is bent to increase a length of the channel in a limited area. As the length of the channel is increased, a driving range of the gate voltage Vg applied to the gate electrode 155 of the driving transistor T1 is increased, and a driving current $I_d$ is constantly increased according to the gate voltage Vg. Accordingly, the magnitude of the gate voltage Vg can be changed such that grayscales of light emitted from the organic light emitting diode OLED can be more precisely controlled, and display quality of the organic light emitting diode display can be improved. In addition, the channel is extended in several directions rather than in one direction, and thus an influence due to directivity in a manufacturing process can be offset, thereby reducing process variation. Thus, image deterioration such as a stain defect (e.g., a luminance differences occurs depending on pixels even though the same data voltage Dm is applied) that may occur due to variation of the characteristics of the driving transistor T1 due to process variation can be prevented. Such a shape of the channel is not limited to the structure shown in the drawing, and may have various structures such as an Ω-type, an S-type, and the like.

The gate electrode 155 also functions as the second storage electrode of the storage capacitor Cst. That is, the storage capacitor Cst includes the first storage electrode and the second storage electrode that overlap each other, disposing the second insulation layer 142 therebetween. The second storage electrode corresponds to the gate electrode 155 of the driving transistor T1, and the first storage electrode is an expanded portion of the sustain line 126. Here, the second insulation layer 142 becomes a dielectric material, and charges charged in the storage capacitor Cst and a voltage between the first and second storage electrodes and determine capacitance. Since the driving voltage line 172 is connected to the first storage electrode E1 through the opening 68, charges that correspond to a difference between the driving voltage ELVDD and the gate voltage Vg of the gate electrode 155 are stored in the storage capacitor Cst. In addition, since the gate electrode 155 is used as the second storage electrode, the driving transistor T1 can have a sufficient size and the storage capacitor Cst can have sufficient capacitance even in a small-sized pixel because the driving transistor T1 and the storage capacitor Cst are disposed while overlapping each other.

A gate electrode of the second transistor T2 is an expanded portion of the scan line 151. A first electrode S2 of the second transistor T2 is connected with the data line 171 through the opening 62, and thus, the second electrode D2 is connected with the first electrode S1 of the driving transistor T1. The channel of the second transistor T2 is disposed on the semiconductor layer PS between the first electrode S2 and the second electrode D2.

The third transistor T3 is formed of two transistors T3-1 and T3-2 that are adjacent to each other and connected in series. The third transistor T3 is serially connected to block flow of a leakage current. A structure in which the two transistors T3-1 and T3-2 are connected in series implies a structure in which two gate electrodes receive the same signal and are turned on simultaneously by the same gate signal such that a signal input to one transistor is output through the other transistor. That is, gate electrodes of the transistors T3-1 and T3-2 are disposed on the scan lines 151, and channels are formed in the semiconductor layer PS that overlaps the gate electrodes. A first electrode S3-2 of the transistor T3-2 is connected with a first electrode S6 of the sixth transistor T6 and the second electrode D1 of the driving transistor T1, and a second electrode D3-1 of the transistor T3-1 is connected with a first electrode S4-1 of the transistor T4-1. In addition, a second electrode D3-1 of the transistor T3-1 is connected with the first gate electrode 155 through the first opening 51. The first electrode S3-1 of the transistor T3-1 and the second electrode D3-2 of the transistor T3-2 are connected with each other.

The fourth transistor T4 is also formed of two transistors T4-1 and T4-2, and the two transistors T4-1 and T4-2 are connected in series. That is, gate electrodes of the transistors T4-1 and T4-2 are disposed on the previous scan line 152, and channels are formed in the semiconductor layer PS that overlaps the gate electrodes of the transistors T4-1 and T4-2. The first electrode S4-1 of the transistor T4-1 is connected with the second electrode D3-1 of the transistor T3-1, a second electrode D4-2 of the transistor T4-2 is connected with a second electrode D7 of the seventh transistor T7, and the second electrode D4-1 of the transistor T4-1 and the first electrode S4-2 of the transistor T4-2 are connected with each other. As described, the serially connected structure can prevent a current leakage. The second electrode D4-2 of the fourth transistor T4-2 is directly connected with the initialization voltage line 157 through the second opening 54. The first electrode S4-1 of the transistor T4-1 is connected with the first gate electrode 155 through the first opening 51.

A gate electrode of the fifth transistor T5 is a part of the light emission control line 153, and a channel thereof is formed in the semiconductor layer PS that overlaps the gate electrode of the fifth transistor T5. The driving voltage line 172 is connected to the first electrode S5 of the fifth transistor T5 through the opening 67, and the second electrode D5 is connected with the first electrode S1 of the driving transistor T1.

A gate electrode of the sixth transistor T6 is a part of the light emission control line 153, and a channel thereof is formed in the semiconductor layer PS that overlaps the gate electrode of the sixth transistor T6. A second electrode D6 of the sixth transistor T6 is connected with the data connection member 73 through the opening 69, and the first electrode S6 is connected with the second electrode D1 of the driving transistor T1.

The seventh transistor T7 is a part of the previous scan line 152, and a channel is formed in the semiconductor layer PS that overlaps the gate electrode of the seventh transistor T7. The first electrode S7 of the seventh transistor T7 is connected with the data connection member 73 through the opening 69, and the second electrode D7 is connected with the second electrode D4-2 of the transistor T4-2.

Hereinabove, the first electrode and the second electrode of the plurality of transistors T1, T2, T3, T4, T5, T6, and T7 have been described, and when one of the first electrode and the second electrode is a source region, the other corresponds to a drain region. In addition, depending on exemplary embodiments, the source region and the drain region described with reference to FIG. 1 may be switched.

The semiconductor layer PS of the present exemplary embodiment is directly connected with a first conductor disposed thereabove through the expansion portions PSE and PSE2 while overlapping the first conductor. Accordingly, an area of a structure (including openings) for electrical connection in each pixel PX can be reduced. In addition, since no additional connection wire is needed, the number of openings can be reduced and an area occupied by the openings can be reduced.

In each pixel PX of the present exemplary embodiment, a total of six openings 51, 54, 62, 67, 68, 69 are formed, excluding the opening 81 connected with the pixel electrode. Six openings is the minimum number in a pixel PX that includes 7 transistors and one storage capacitor Cst, and accordingly, the area for the pixel PX can be reduced and can be applied to a high-resolution organic light emitting diode display.

In addition, when a high-resolution pixel PX is formed, the greater the number of structures connected through the opening, the greater the probability of failure and thus the yield is decreased. That is, a total of a hundred twenty (120) display devices are formed in one mother substrate, and the following Table 1 shows comparison of probability of failure occurrence between an exemplary embodiment in which one pixel has six openings and comparative examples in which one pixel has eight or ten openings in a case that one display device has 1440×2880 pixels (QHD resolution).

TABLE 1

|  | Exemplary embodiment | Comparative Example 1 | Comparative Example 2 |
| --- | --- | --- | --- |
| Number of openings per pixel | 6 | 8 | 10 |
| Number of pixels per display device | 1440 × 2880 | 1440 × 2880 | 1440 × 2880 |
| Number of openings per display device | (1440 × 2880 × 6) 24,883,200 | (1440 × 2880 × 8) 33,177,600 | (1440 × 2880 × 10) 41,472,000 |
| Number of display devices included in mother substrate | 120 | 120 | 120 |
| Number of openings included in mother substrate | 2,985,984,000 | 3,981,312,000 | 4,976,640,000 |
| Number of defective openings | 2986 | 3981 | 4977 |
| Comparison of defect ratio | The defect ratio is reduced by 25% compared to Comparative Example 1, and the defect ratio is reduced by 40% compared to Comparative Example 2 | | |

Here, the defect ratio was calculated with a probability of one in one million. That is, it can be determined that the defect ratio can be reduced by about 25% by a reduction of only two openings of one pixel PX. Therefore, when a high-resolution pixel is formed, it is preferable to use a pixel structure having a small number of openings in terms of reduction of an area occupied by the pixel and the defect ratio.

In the present exemplary embodiment, the doped semiconductor layer PS is formed below the previous scan line 152. Accordingly, an area occupied by the two transistors T4-1 and T4-2 is reduced.

In general, a channel is formed in a portion where a wire, e.g., a previous scan line, and a semiconductor layer overlap each other, and a width of the wire exceeds a predetermined width. In this case, the wire and the semiconductor layer need to be overlapped with each other in two portions in order to form two channels, thereby causing an increase of the area. In contrast, in the present exemplary embodiment, a doped area is formed below one wire and channels are formed at opposite sides of the doped area such that an area occupied by two transistors can be reduced.

In addition, even if the doping mask PBLK is misaligned, the size of channels of the fourth transistor T4 is not changed. That is, when the doping mask PBLK is vertically misaligned, a channel length L of T4-1 of the transistor T4-1 and a channel length L of T4-2 of the transistor T4-2 may be changed, but the length of the transistor T4 is not changed since the length of the fourth transistor T4 is the sum of the channel length L of T4-1 of the transistor T4-1 and the channel length L of T4-2 of the transistor T4-2.

In addition, the third transistor T3 and the fourth transistor T4 have a structure in which two transistors are serially connected, and accordingly, a leakage current can be reduced.

Hereinafter, a structure of the pixel of the organic light emitting diode display according to a manufacturing sequence will be described with reference to FIG. 3 to FIG. 16, together with FIG. 1 and FIG. 2. FIG. 3 to FIG. 16 are layout views and cross-sectional views that show stages in a method for manufacturing a pixel of the organic light emitting diode display according to the exemplary embodiment of FIGS. 1-2.

Figure 4:
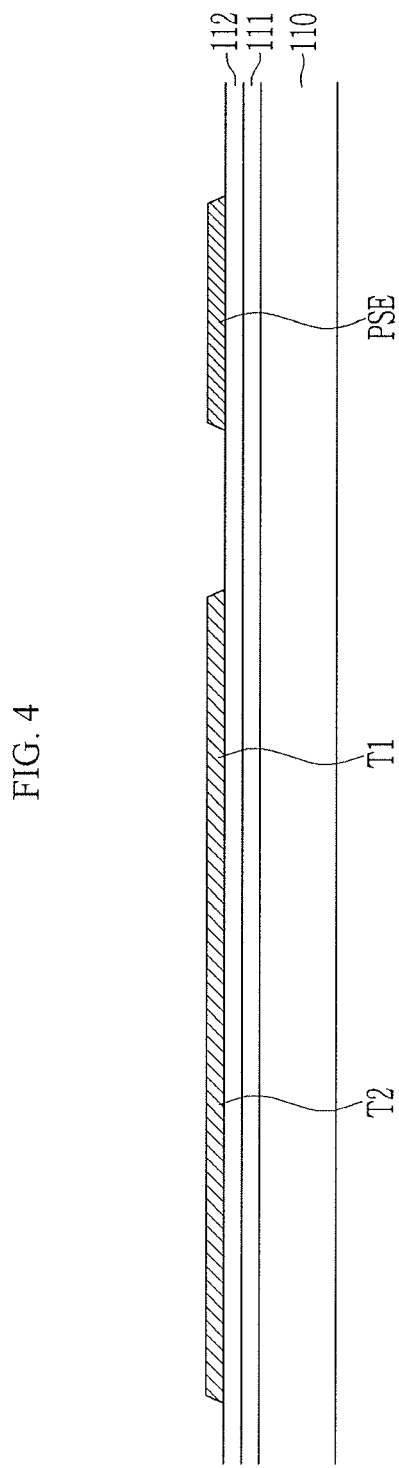

First, referring to FIGS. 3-4, a barrier layer 111 is disposed on the substrate 110, and a buffer layer 112 is disposed on the barrier layer 111. The semiconductor layer PS is disposed on the buffer layer 112. The shape of the semiconductor layer PS in top view is illustrated in FIG. 3, and FIG. 4 is a cross-sectional view along line IV-IV of FIG. 3.

The organic light emitting diode display according to the present exemplary embodiment may be a flexible display device that uses a plastic or a polyimide (PI) substrate. Depending on exemplary embodiments, the substrate 110 and the barrier layer 111 may be provided in plural. For example, the barrier layer 111 may be disposed on the substrate 110, and then another substrate 110 and another barrier layer 111 may be disposed thereabove. In another example, after repeating such a unit structure of the substrate 110 and the barrier layer 111, the buffer layer 112 may be disposed on top of the unit structures. However, depending on exemplary embodiments, a glass substrate may be used, and in this case, the barrier layer 111 or the buffer layer 112 may be omitted. The barrier layer 111 and the buffer layer 112 may include an inorganic insulating material, e.g., a silicon oxide, a silicon nitride, an aluminum oxide, and the like, or may include an organic insulation material, e.g., a polyimide, a polyacryl (epoxy added), and the like.

Referring to FIG. 3 and FIG. 4, the semiconductor layer PS that includes the channels, the first electrodes, and the second electrodes of the plurality of transistors T1, T2, T3, T4, T5, T6, and T7 is disposed on the buffer layer 112. The structure of the semiconductor layer PS is illustrated in FIG. 3.

The semiconductor layer PS is formed of a polycrystalline semiconductor, and may be formed by forming amorphous silicon and then crystallizing the amorphous silicon. Depending on exemplary embodiments, the semiconductor layer PS may be formed of an oxide semiconductor.

The semiconductor layer PS has a structure that is vertically extended with reference to opposite sides of the channel of the driving transistor T1, e.g., the semiconductor layer PS may have a longitudinal direction extending along the second direction Y of FIG. 1. The channel of the driving transistor T1 of the present exemplary embodiment is bent downward while extending to the right side and then extends to the right again. However, the structure of the channel of the driving transistor T1 is not limited thereto, and may have various structures such as an Ω-type, an S-type, and the like.

As described previously with reference to FIG. 1, the first electrode S1 is disposed at the left side of the channel of the driving transistor T1, and the channel of the second transistor T2 is disposed in a portion of the semiconductor layer PS, which extends upward from the first electrode S1. Meanwhile, the channel of the fifth transistor T5 is disposed in a portion of the semiconductor layer PS, which extends downward from the first electrode S1. The second electrode D1 is disposed at the right side of the channel of the driving transistor T1, and the channel of the sixth transistor T6 is disposed in a portion of the semiconductor layer PS, which extends downward from the second electrode D1. A semiconductor layer PS of a pixel PX at a next stage is connected below the channel of the sixth transistor T6. Meanwhile, the semiconductor layer PS extends upward from the second electrode D1 and is bent several times, and the channels of the transistor T3-2, the transistor T3-1, the transistor T4-1, the transistor T4-2, and the seventh transistor T7 are sequentially disposed from the second electrode D1. More specifically, the semiconductor layer PS that has been extended upward from the second electrode D1 is bent left after passing through the channel of the transistor T3-2 and then bent downward such that it passes through the channel of the transistor T3-1. After passing through the channel of the transistor T3-1, the semiconductor layer PS is bent left again and then bent upward such that it sequentially meets the channel of the transistor T4-1 and the channel of the transistor T4-2. After sequentially meeting the channel of the transistor T4-1 and the channel of the transistor T4-2, the semiconductor layer PS passes through the channel of the seventh transistor T7 and then is bent right again, and then is bent upward such that it is connected with the semiconductor layer PS of the pixel PX of the previous stage.

In addition, the semiconductor layer PS may include an expansion portion for connection with wiring that is disposed in another layer. The semiconductor layer PS extended upward from the channel of the second transistor T2 includes an expansion portion that is expanded to receive the data voltage Dm. The semiconductor layer PS at a portion that is bent downward from the channel of the fifth transistor T5 and then bent right includes an expansion portion that is expanded to receive a driving voltage ELVDD. The semiconductor layer PS at a portion extended downward from the channel of the sixth transistor T6 includes an expansion portion that is expanded to be connected with a data connection member 73 and to apply a driving current to the organic light emitting diode OLED through a pixel electrode that is disposed thereabove.

In addition, the semiconductor layer PS according to the present exemplary embodiment further includes a first expansion portion PSE that is disposed between the channel of the transistor T3-1 and the channel of the transistor T4-1, and the first expansion portion PSE is a portion that is connected with a gate electrode G1 (FIG. 19). Further, the semiconductor layer PS further includes a second expansion portion PSE2 that extends to the left and then is expanded between the channel of the transistor T4-2 and the channel of the seventh transistor T7, and the second expansion portion PSE2 is a portion expanded to receive the initialization voltage Vint.

Figure 6:
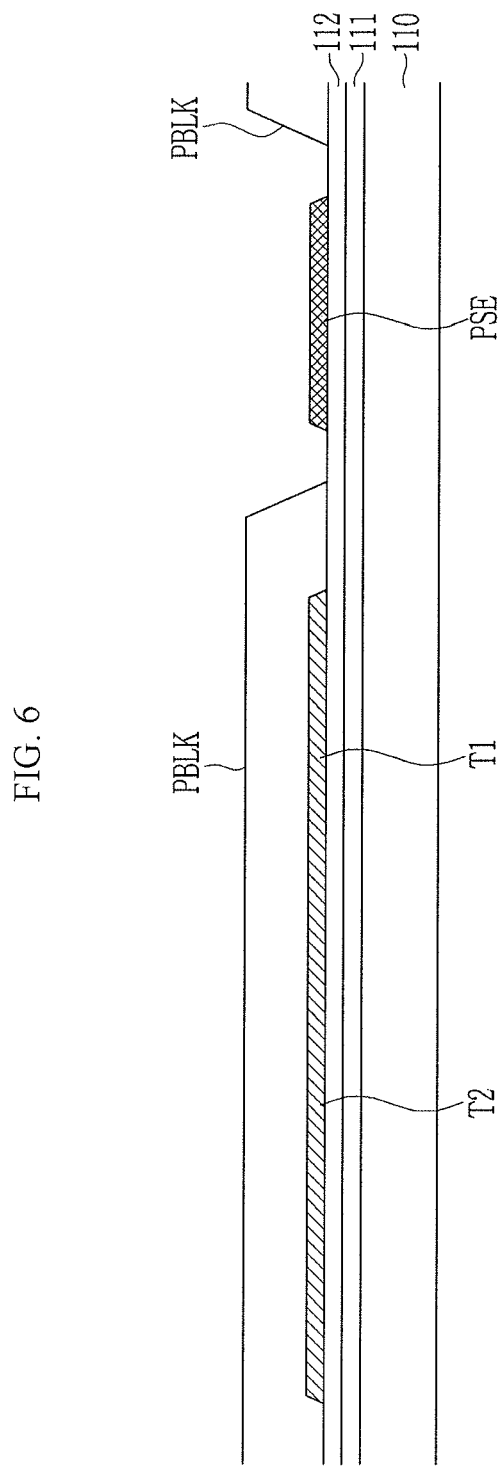

The semiconductor layer PS having such a structure undergoes a wiring process through a doping process, which is shown in FIG. 5 and FIG. 6. FIG. 5 is a top view of the pixel PX, and FIG. 6 is a cross-sectional view along line VI-VI of FIG. 5.

In FIG. 5, a portion where the doping mask PBLK is not formed is marked with a hatch pattern, and a direction of the hatch pattern is perpendicular to a direction of the hatch pattern used for marking the semiconductor layer PS. The doping mask PBLK is disposed in portions where the corresponding hatch patterns are not drawn, and accordingly, the semiconductor layer PS disposed in the portions is not doped. However, the semiconductor layer PS disposed in the portions marked with the hatch pattern in FIG. 5 is doped. In order to distinguish the doped semiconductor layer PS and the non-doped semiconductor layer PS, a semiconductor layer PS marked with a crosshatch pattern is illustrated in FIG. 5. In other words, the hatch patterns of the non-doped semiconductor layer PS and of areas exposed by the doping mask PBLK are oriented in different directions, so overlapping portions of the semiconductor layer PS (to be doped) and the areas exposed by the doping mask PBLK are cross-hatched. It is further noted that in FIG. 5 the border of the doping mask PBLK is illustrated with a bold, solid line.

As shown in FIG. 6, the doping mask PBLK is formed on a portion of the semiconductor layer PS which is not doped, and a P-type impurity is wholly doped in portions of the semiconductor layer PS exposed by the doping mask PBLK. In the present exemplary embodiment, a photosensitive material, e.g., a photoresist, is used as the doping mask PBLK, and is formed thick enough to prevent the P-type impurity from contacting the semiconductor layer PS. When doping is carried out as described above, the semiconductor layer PS exposed to an area where the doping mask PBLK is not formed (i.e., area with a hatch pattern traced with a bold line in FIG. 5) is doped and thus has the same characteristic as a wire. In FIG. 5 and FIG. 6, the semiconductor layer PS that is doped and turned to a wire is illustrated with a crosshatch pattern.

Figure 7:
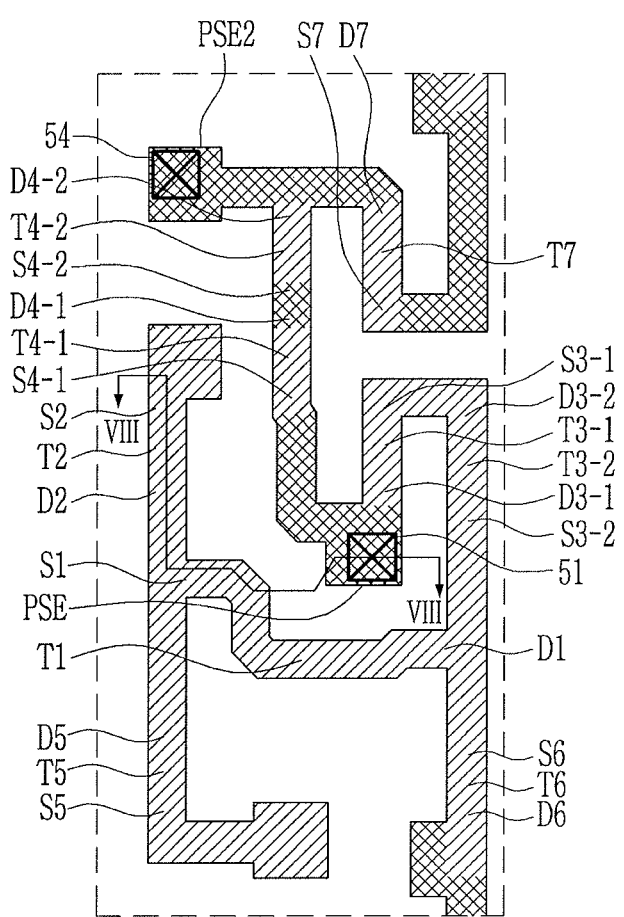
Figure 8:
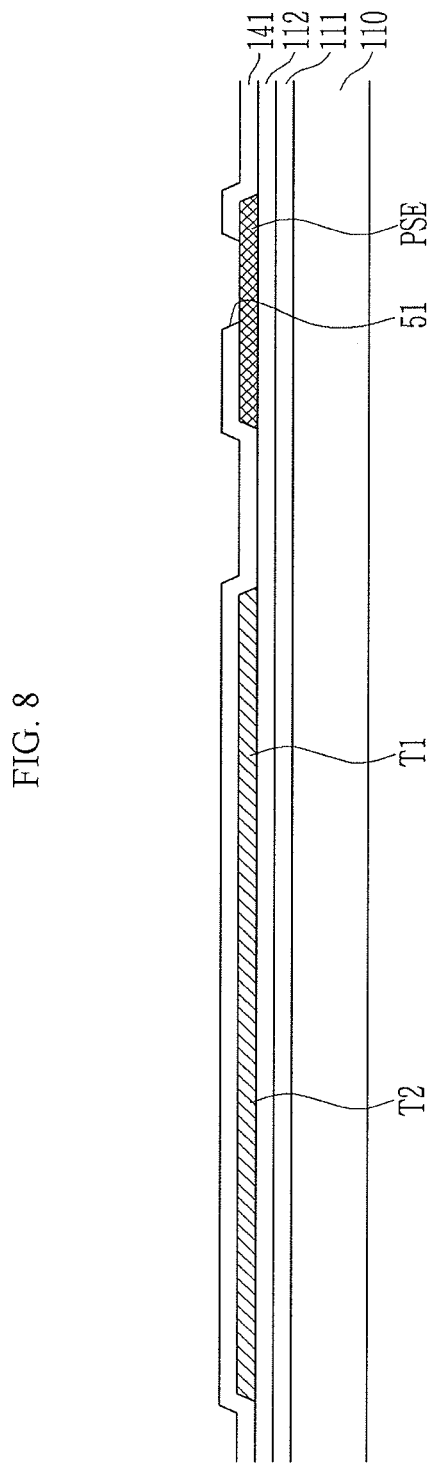

Next, referring to FIG. 7 and FIG. 8, the doping mask PBLK is removed, and the first insulation layer 141 is formed, e.g., on the entire substrate 110. FIG. 7 is a top view of the pixel PX, and FIG. 8 is a cross-sectional view along line VIII-VIII of FIG. 7.

In detail, the first insulation layer 141 that covers the semiconductor layer PS and the buffer layer 112 is formed on the semiconductor layer PS and the buffer layer 112. The first insulation layer 141 may be formed of, e.g., a silicon nitride, a silicon oxide, and an aluminum oxide, and in the present exemplary embodiment, the first insulation layer 141 is formed of a silicon oxide.

As illustrated in FIG. 7 and FIG. 8, the first and second openings 51 and 54 are formed in, e.g., through, the first insulation layer 141. The two openings 51 and 54 respectively expose the two expansion portions PSE and PSE2 of the semiconductor layer PS.

Figure 9:
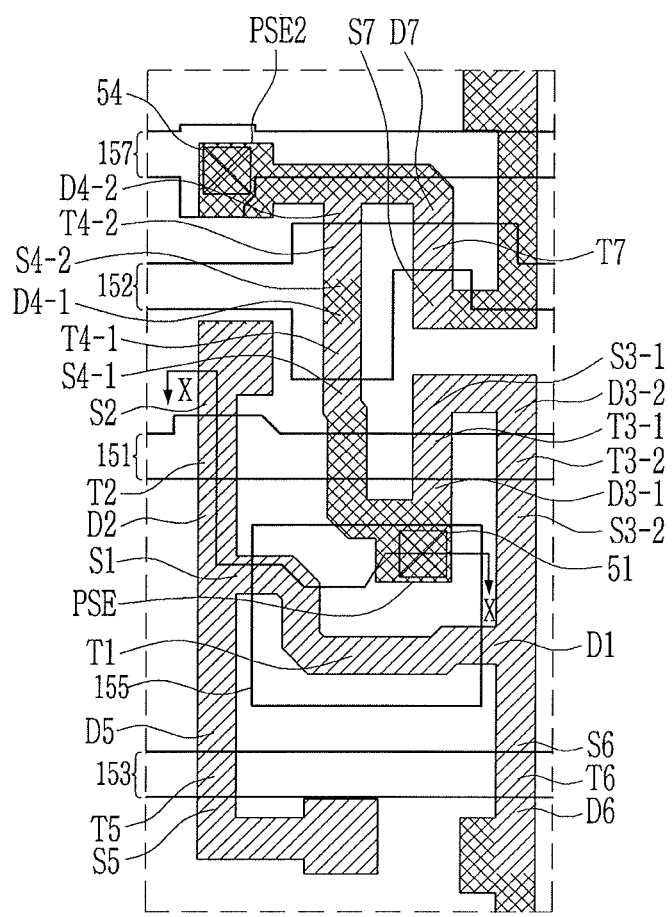
Figure 10:
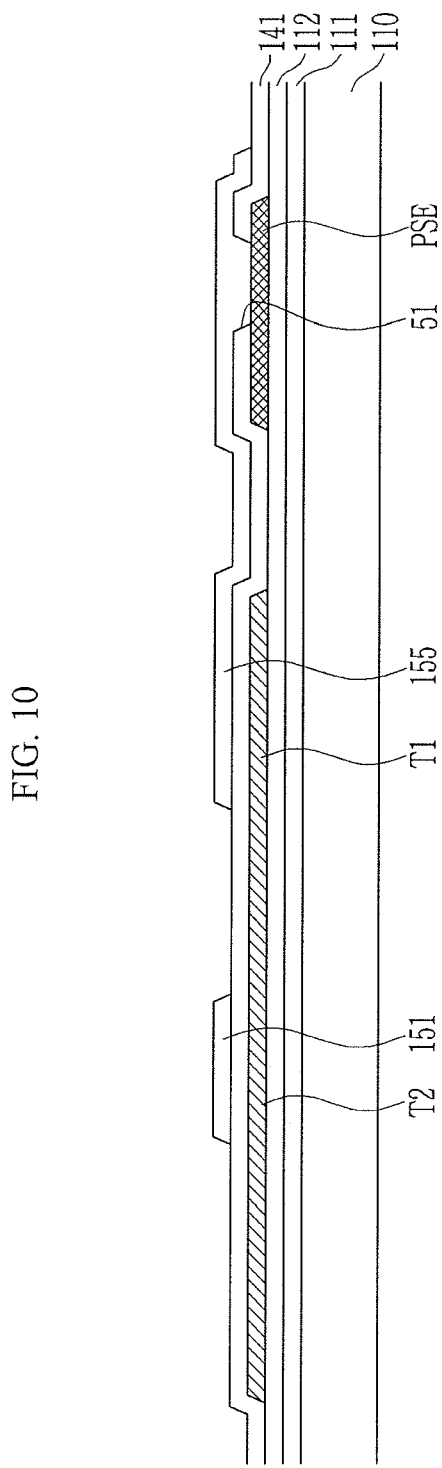

A process for forming a first conductor will now be described with reference to FIG. 9 and FIG. 10. FIG. 9 is a top view of the pixel PX, and FIG. 10 is a cross-sectional view along line X-X of FIG. 9.

The first conductor may be formed of various metals, e.g., molybdenum (Mo) is used to form the first conductor in the present exemplary embodiment. In another example, the first conductor may have a plurality of metal layers. The first conductor includes the scan line 151, the previous scan line 152, the light emission control line 153, the initialization voltage line 157, and the gate electrode 155. After forming the first conductor, the semiconductor layer PS is additionally doped and then the P-type impurity is doped in portions of the semiconductor layer PS exposed by the first conductor. After this additional doping process, undoped portions of the semiconductor layer PS will be channels of transistors.

The scan line 151, the previous scan line 152, the light emission control line 153, and the initialization voltage line 157 that extend in the first direction and respectively transmit the scan signal Sn, the previous scan signal Sn-1, the light emission control signal En, and the initialization voltage Vint are formed on the first insulation layer 141.

First, the scan line 151 extends in the first direction, and overlaps the channel of the second transistor T2, the channel of the transistor T3-1, and the channel of the transistor T3-2. In addition, the scan line 151 overlaps a portion of the semiconductor layer PS, which is doped between the channel of the transistor T3-1 and the channel of the transistor T4-1. In the present exemplary embodiment, an area that overlaps the channel of the second transistor T2 has a wide width. Transistors are formed in portions of the semiconductor layer PS, which are not doped, and overlap with the scan line 151, and the second transistor T2, the transistor T3-1, and the transistor T3-2 are formed in the overlapped portions.

The previous scan line 152 extends in the first direction, and overlaps the channel of the transistor T4-1, the channel of the transistor T4-2, and the channel of the seventh transistor T7 while extending in the first direction. In addition, the previous scan line 152 overlaps portions of the semiconductor layer PS, which are doped between the channel of the transistor T4-1 and the channel of the transistor T4-2, and also overlaps a portion of the semiconductor layer PS, which extends to a pixel at a previous stage from the channel of the seventh transistor T7. In the present exemplary embodiment, the previous scan line 152 includes an expansion area that expands at a portion that overlaps the channel of the transistor T4-1 and the channel of the transistor T4-2, and is bent downward while passing through the channel of the seventh transistor T7. Transistors are formed in portions where the previous scan line 152 and portions of the semiconductor layer PS, which are not doped, overlap each other, and the transistor T4-1, the transistor T4-2, and the seventh transistor T7 are respectively formed in the overlapped portions.

The light emission control line 153 also extends in the first direction, and overlaps the channel of the fifth transistor T5 and the channel of the sixth transistor T6 while extending in the first direction. Transistors are formed in portions where the light emission control line 153 and portions of the semiconductor layer PS, which are not doped, overlap each other, and the fifth transistor T5 and the sixth transistor T6 are respectively formed in the overlapped portions.

The initialization voltage line 157 also extends in the first direction, and only overlaps the doped portions of the semiconductor layer PS, such that no transistor is formed. The initialization voltage line 157 of the present exemplary embodiment has a wide width at a portion of the second expansion portion PSE2 of the semiconductor layer PS, and is directly connected with the second expansion portion PSE2 by the second opening 54. Accordingly, the initialization voltage Vint is applied to the semiconductor layer PS through the second expansion portion PSE2.

Meanwhile, the gate electrode 155 of the driving transistor T1 is also formed on the first insulation layer 141. The gate electrode 155 has a quadrangular structure, and not only overlaps the channel of the driving transistor T1 but also overlaps the first expansion portion PSE of the semiconductor layer PS. Since a transistor is formed in a portion where the gate electrode 155 and an undoped portion of the semiconductor layer PS overlap each other, the driving transistor T1 is formed in the portion. In addition, the gate electrode 155 overlaps the first expansion portion PSE, which is a doped portion of the semiconductor layer PS, and is directly connected with the first expansion portion PSE through the first opening 51. Accordingly, a voltage applied to the gate electrode 155 of the driving transistor T1 is affected by operation of the transistor T3-1 and the transistor T4-1. In addition, the gate electrode 155 of the driving transistor T1 also functions as a second storage electrode of a storage capacitor Cst.

Figure 11:
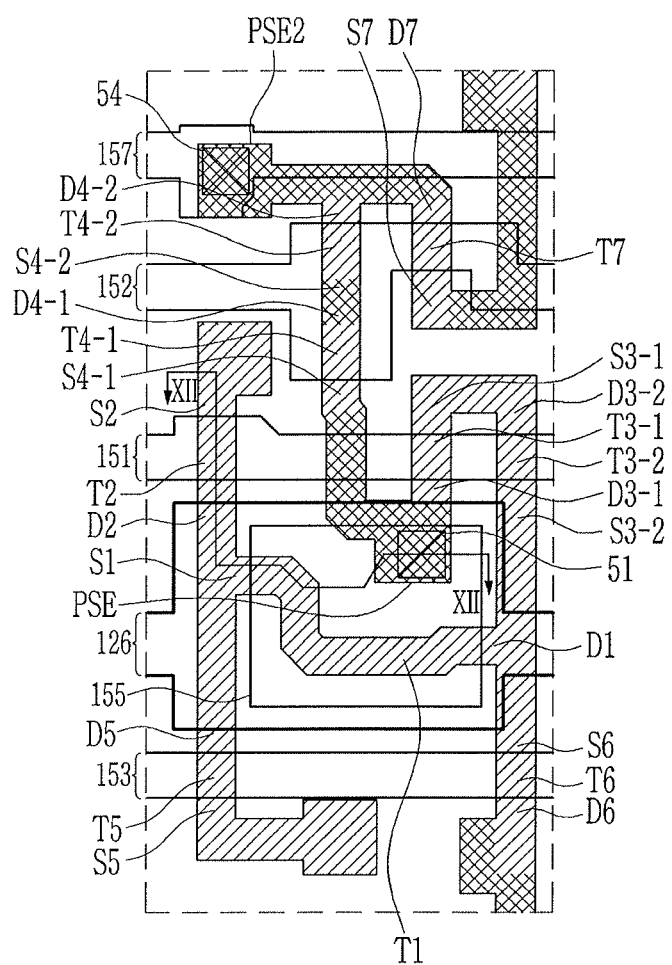
Figure 12:
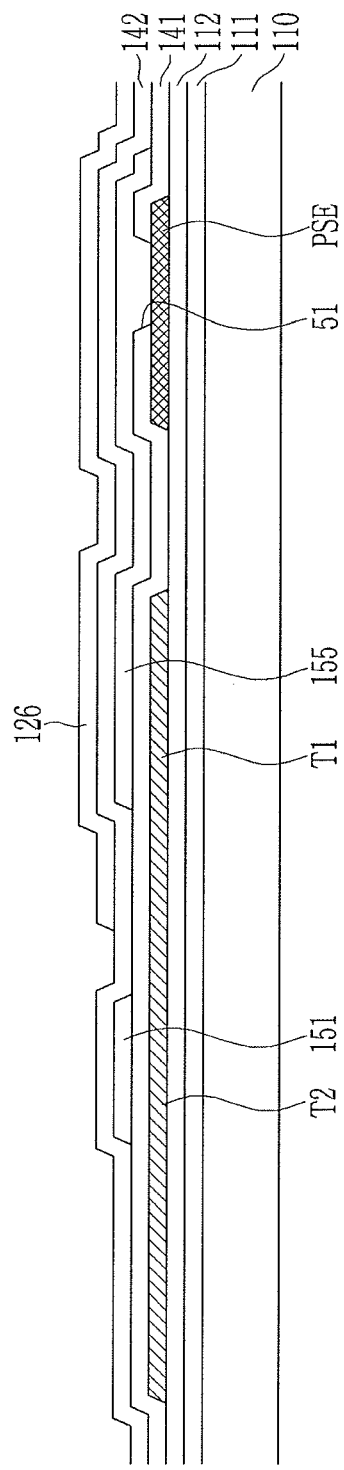

Next, referring to FIG. 11 and FIG. 12, a second insulation layer 142 that covers the first conductor is disposed on the first conductor. FIG. 11 is a top view of the pixel PX, and FIG. 12 is a cross-sectional view along line XII-XII of FIG. 11.

In detail, the second insulation layer 142 may be formed of, e.g., a silicon nitride, a silicon oxide, and an aluminum oxide, and in the present exemplary embodiment, the second insulation layer 142 is formed of a silicon oxide. As shown in FIG. 11 and FIG. 12, a second conductor is disposed on the second insulation layer 142. The second conductor may be formed of, e.g., molybdenum (Mo). In addition, the second conductor may have a plurality of metal layers.

The second conductor includes the sustain line 126, and an expanded portion of the sustain line 126 functions as the first storage electrode. The sustain line 126 extends in the first direction, and has an expanded width at a portion that overlaps the gate electrode 155. The expanded width of the sustain line 126 is formed to wholly, e.g., completely, cover the gate electrode 155. The expanded portion of the sustain line 126 overlaps the gate electrode 155 on a plane while disposing the second insulation layer 142 therebetween such that the storage capacitor Cst is formed. The expanded portion of the sustain line 126 forms the first storage electrode, and the gate electrode 155 forms the second storage electrode. The expanded portion of the sustain line 126 has a quadrangular structure, and has no opened portion such that the inside of the quadrangular structure is filled with a metallic material. Accordingly, sufficient capacitance of the storage capacitor Cst can be assured even though an area where the pixel PX is formed is reduced.

Figure 13:
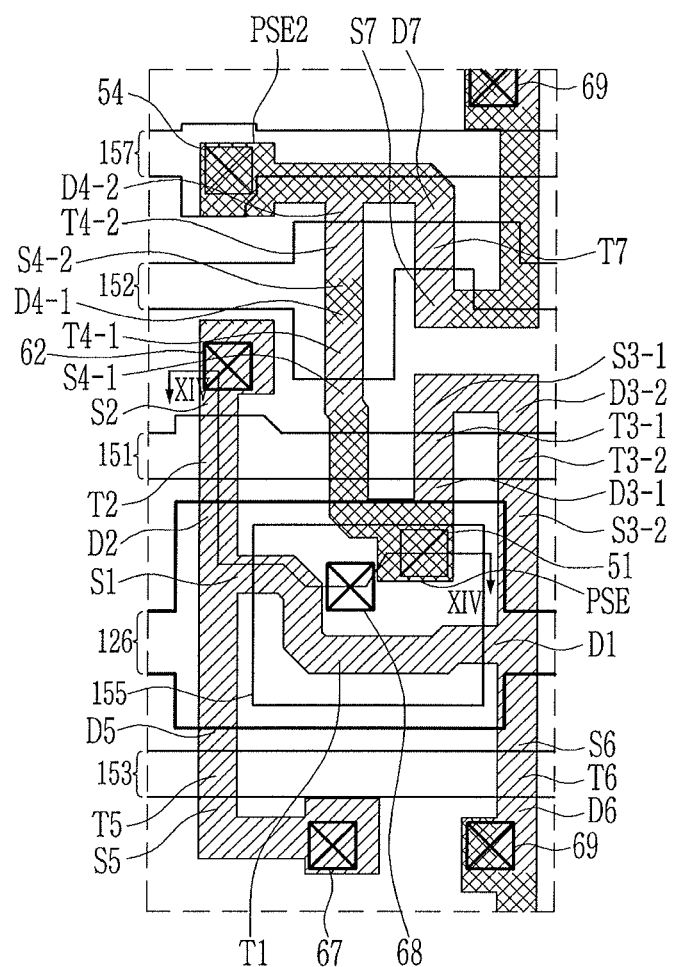
Figure 14:
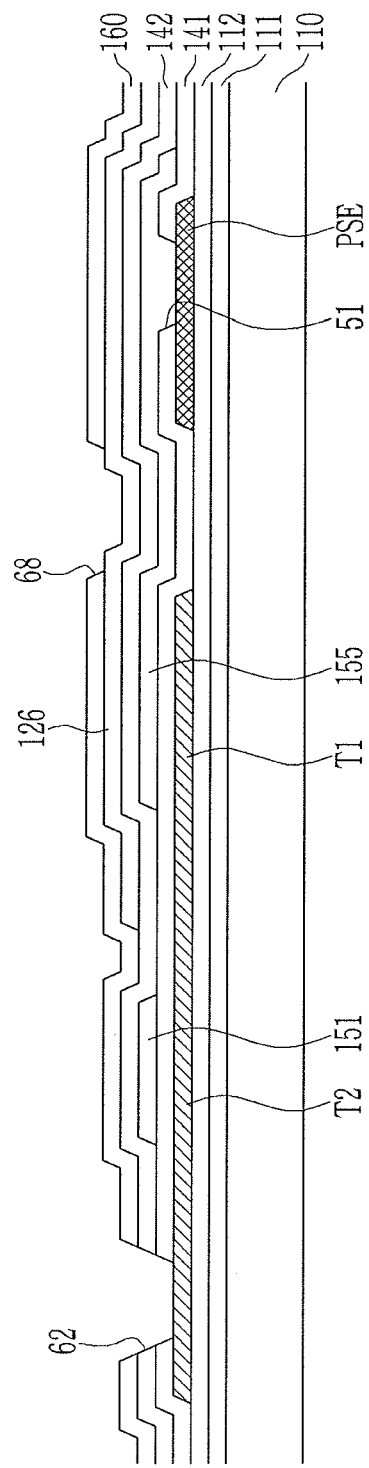

Next, referring to FIG. 13 and FIG. 14, a third insulation layer 160 that covers the second conductor is formed on the second conductor. FIG. 13 is a top view of the pixel PX, and FIG. 14 is a cross-sectional view along line XIV-XIV of FIG. 13.

In detail, the third insulation layer 160 may be formed of, e.g., a silicon nitride, a silicon oxide, and an aluminum oxide, or may be formed of an organic insulation material. The present exemplary embodiment, the third insulation layer 160 is formed of a silicon nitride or a silicon oxide. Four openings 62, 67, 68, and 69 are formed in the third insulation layer 160.

The opening 62 is disposed above the channel of the second transistor T2 of the semiconductor layer PS, and exposes an expansion portion that is expanded to receive a data voltage Dm. The opening 67 is disposed below the channel of the fifth transistor T5 of the semiconductor layer PS, and exposes an expansion portion that is expanded to receive the driving voltage ELVDD. The opening 69 is disposed below the channel of sixth transistor T6, and exposes an expansion portion that is expanded to apply a driving current to the organic light emitting diode OLED. The opening 68 exposes a part of the expanded portion of the sustain line 126. Accordingly, even if the opening 68 is formed only in the third insulation layer 160, the openings 62, 67, and 69 are formed in the first insulation layer 141, the second insulation layer 142, and the third insulation layer 160.

Figure 15:
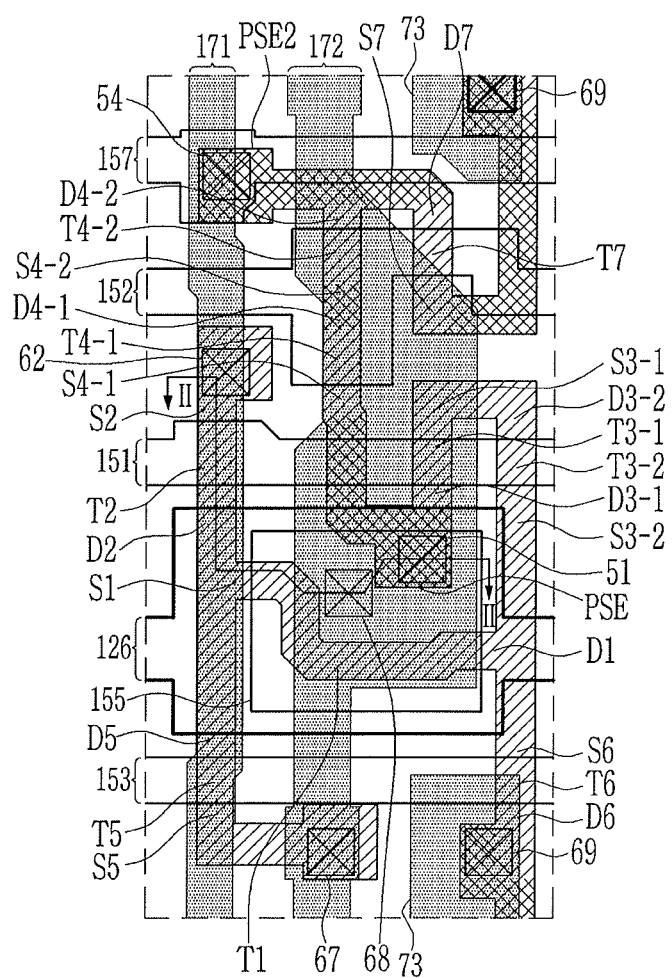
Figure 16:
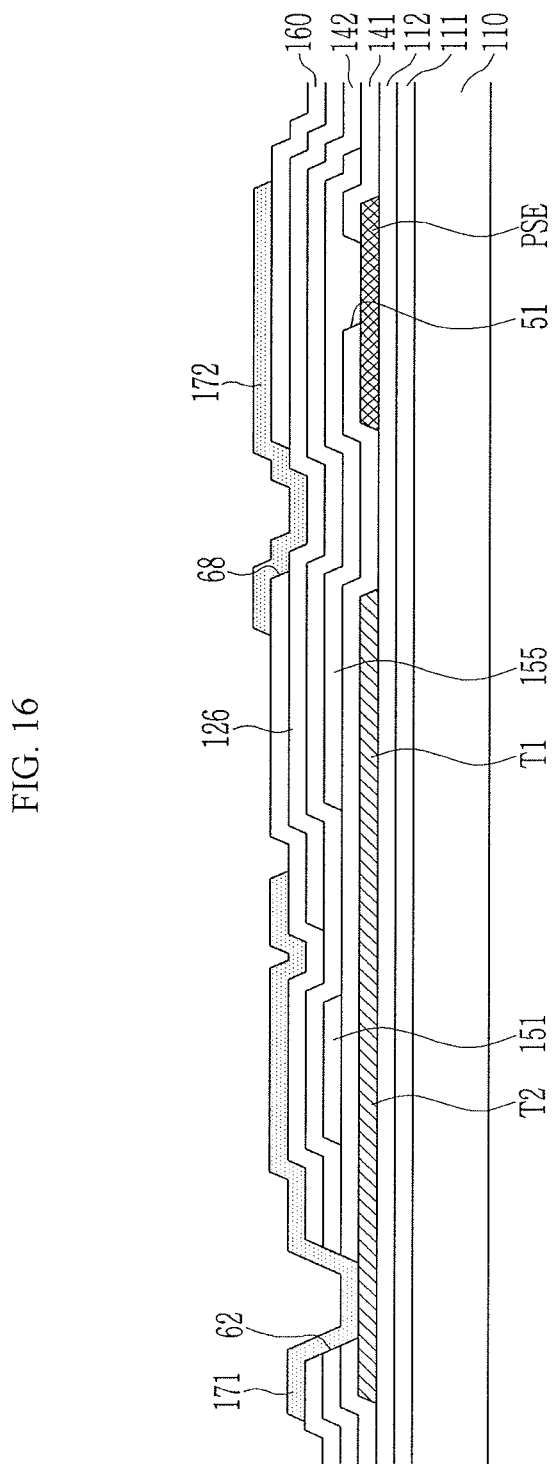

Next, referring to FIG. 15 and FIG. 16, a third conductor is formed on the third insulation layer 160. FIG. 15 is a top view of the pixel PX, and FIG. 16 is a cross-sectional view along line II-II of FIG. 15.

In detail, the third conductor may be formed of various metals, and may include a plurality of metal layers. In the present exemplary embodiment, the third conductor has a triple layer structure of titanium (Ti), aluminum (Al), and titanium (Ti). The third conductor includes a data line 171, a driving voltage line 172, and a data connection member 73.

The data line 171 extends in the second direction, and may be partially bent. The data line 171 transmits the data voltage Dm to the first electrode S2 of the second transistor T2 through the opening 62.

The driving voltage line 172 extends in the second direction, and includes an expansion portion that is partially bent and has an expanded width. The expansion portion of the driving voltage line 172 is expanded to cover a part of the driving transistor T1, a part of the transistors T3-1 and T3-2, and a part of the transistors T4-1 and T4-2. The expansion portion applies the driving voltage ELVDD to the sustain line 126 through the opening 68 at a portion that overlaps the expanded portion of the sustain line 126. Accordingly, the first storage electrode of the storage capacitor Cst is applied with the driving voltage ELVDD. The expansion portion of the driving voltage line 172 covers at least a part of a connection portion of the serially connected transistors T3-1 and T3-2. That is, the connection portion is a portion to which the first electrode S3-1 of the transistor T3-1 and the second electrode D3-2 of the transistor T3-2 are directly connected, and is disposed on the semiconductor layer PS. Since the expansion portion of the driving voltage line 172 covers the connection portion of the transistors T3-1 and T3-2, a voltage of the connection portion can be stabilized. When the voltage of the connection portion of the third transistors T3-1 and T3-2 is stabilized, a characteristic of the driving transistor T1 of each pixel PX can be stabilized. This is because the outputs of the transistors T3-1 and T3-2 and the gate electrode 155 of the driving transistor T1 are electrically connected with each other, and the data voltage Dm is passed through the transistors T3-1 and T3-2 and stored in the storage capacitor Cst. The expansion portion of the driving voltage line 172 partially overlaps the transistors T4-1 and T4-2 and the driving transistor T1, and an overlapped area can be adjusted depending on features of exemplary embodiments. In addition, the driving voltage line 172 applies the driving voltage ELVDD to the first electrode S5 of the fifth transistor T5 through the opening 67, and has a width that is slightly widened at the periphery of the opening 67.

The data connection member 73 is electrically connected with the expansion portion of the semiconductor layer PS, which is disposed below the channel of the sixth transistor T6, through the opening 69. The data connection member 73 transmits a driving current to the organic light emitting diode OLED.

Referring back to FIG. 1 and FIG. 2, the passivation layer 180 that covers the third conductor is formed on the third conductor. The passivation layer 180 may be formed of an organic insulation material, and in the present exemplary embodiment, the passivation layer 180 is formed of a polyimide (PI).

A pixel electrode is disposed on the passivation layer 180. The pixel electrode is connected with the data connection member 73 through the opening 81 formed in the passivation layer 180. The pixel electrode may be formed of a transparent conductive material or a metal, and may include a plurality of layers. In the present exemplary embodiment, the passivation layer 180 has a double layered structure of ITO and silver (Ag).

A partition wall and a spacer may be disposed on the passivation layer 180 and the pixel electrode. The partition wall has an open portion that overlaps the pixel electrode, and an organic emission layer is disposed in the open portion. A common electrode is disposed on the organic emission layer and the partition wall. The pixel electrode, the organic emission layer, and the common electrode form the organic light emitting diode OLED.

Depending on exemplary embodiments, the pixel electrode may be an anode, which is a hole injection electrode, and the common electrode may be a cathode, which is an electron injection electrode. On the contrary, the pixel electrode may be a cathode and the common electrode may be an anode. Holes and electrons are injected into the organic emission layer from the pixel electrode and the common electrode, respectively, and excitons generated by coupling the injected holes and electrons fall from an excited state to a ground state to emit light.

The partition wall and the spacer may be formed of various organic materials, and in the present exemplary embodiment, they are formed of a polyimide (PI). Since the partition wall and the spacer are formed of the same material, they can be formed together by using one mask, and in this case, a half-tone mask can be used. Accordingly, as the spacer is formed with the half-tone area, the number of masks can be reduced. However, when a high-resolution pixel PX is formed, the partition wall and the spacer may not be formed together by using a half-tone mask. In such a case, the partition wall and the spacer are separately formed by using separate masks.

Hereinafter, the number of masks used in the present exemplary embodiment will be described with reference to FIG. 17. FIG. 17 is a schematic representation of sequential layers deposited on top of each other in the pixel PX of the organic light emitting diode display according to the exemplary embodiment of FIG. 1 and FIG. 2.

In FIG. 17, the sequence of layers is illustrated from the bottom to the top in the order of their formation, where the first (left) column indicates the type/name of layer, the second column indicates a material corresponding to each layer, and the third column in indicates reference numerals in the specification corresponding to each layer. The numbers along the left side of the first column indicate the sequential numbers of the masks used during manufacturing.

In detail, referring to FIGS. 2 and 17, the barrier layer 111 and the buffer layer 112 are sequentially formed on the substrate 110. In FIG. 17, the buffer layer 112 is first described, because when a glass substrate is used instead of a flexible substrate, only the buffer layer 112 is formed on the substrate, and a flexible substrate may be referred to as a substrate and a barrier layer in some cases. In the present exemplary embodiment, the buffer layer 112 may be formed of, e.g., silicon oxide ($SiO_x$) or silicon nitride ($SiN_x$).

Next, the semiconductor layer PS is formed on the buffer layer 112. The semiconductor layer PS is formed by forming an amorphous silicon layer first and then crystallizing it into a polycrystalline semiconductor (p-Si). Then, the first mask is used to form a pattern of the semiconductor layer PS, e.g., the number "1" in FIG. 17 indicates the first mask.

Next, the doping mask PBLK is formed to dope the semiconductor layer PS. The doping mask PBLK may be formed of a photosensitive material such as a photoresist, and may have a thickness such that it can prevent introduction of an impurity during a doping process. The photoresist is wholly, e.g., entirely, stacked and then exposure is performed by using the second mask, and a portion at which a property is changed due to the exposure is removed or maintained such that the doping mask PBLK is formed, e.g., the number "2" in FIG. 17 indicates the second mask. Next, a P-type impurity is doped such that the exposed semiconductor layer PS has the same characteristic as a wire. Subsequently, the doping mask PBLK is removed by using a stripper.

Next, the first insulation layer 141 is wholly stacked. The first insulation layer 141 of the present exemplary embodiment is formed of, e.g., a silicon oxide (SiOx). Next, a photoresist pattern is formed to expose locations where the openings 51 and 54 are formed in the first insulation layer 141 by using the third mask, e.g., the number "3" in FIG. 17 indicates the third mask, and the openings 51 and 54 are formed by removing the exposed first insulation layer 141.

Then, a first conductor is formed. The first conductor of the present exemplary embodiment is formed of molybdenum (Mo), and molybdenum is wholly stacked thereon and then the photoresist pattern is formed by using the fourth mask, e.g., the number "4" in FIG. 17 indicates the fourth mask. Molybdenum exposed due to the photoresist pattern is removed such that first conductor is completed. Accordingly, the scan line 151, the previous scan line 152, the light emission control line 153, the initialization voltage line 157, and the gate electrode 155 are formed. After the first conductor is formed, semiconductor layer PS exposed by the first conductor is additionally doped.

Next, the second insulation layer 142 is wholly stacked. The second insulation layer 142 of the present exemplary embodiment is formed of silicon nitride ($SiN_x$).

Next, a second conductor is formed. The second conductor of the present exemplary embodiment is also formed of molybdenum (Mo), and molybdenum (Mo) is wholly stacked and then a photoresist pattern is formed thereon by using the fifth mask e.g., the number "5" in FIG. 17 indicates the fifth mask. Molybdenum exposed due to the photoresist pattern is removed such that second conductor is completed.

Accordingly, the sustain line 126 that includes the expansion portion, which functions as the first storage electrode, is formed.

Next, the third insulation layer 160 is wholly stacked. The third insulation layer 160 of the present exemplary embodiment may be formed of a silicon oxide ($SiO_x$) or a silicon nitride ($SiN_x$). A photoresist pattern that exposes locations for openings 62, 67, 68, and 69 is then formed by using the sixth mask, e.g., the number "6" in FIG. 17 indicates the sixth mask, and then the exposed third insulation layer 160 is removed such that the openings 62, 67, 68, and 69 are formed. The openings 62, 67, and 69 are formed by removing the exposed third insulation layer 160 and the first and second insulation layers 141 and 142 disposed therebelow, but the opening 68 is formed by removing only the third insulation layer 160.

Next, a third conductor is formed. In the present exemplary embodiment, the third conductor has a three-layered structure of titanium (Ti), aluminum (Al), and titanium (Ti). After sequentially layering metal materials of the three layers, a photoresist pattern is formed thereon by using the seventh mask e.g., the number "7" in FIG. 17 indicates the seventh mask. The third conductor is completed by removing the metal materials of the triple layers exposed due to the photoresist pattern. Accordingly, the data line 171, the driving voltage line 172, and the data connection member 73 are formed.

Next, the passivation layer 180 is wholly formed, and in the present exemplary embodiment, a polyimide (PI) is wholly stacked. Next, the passivation layer 180 at a location for an opening 81 is removed by using the eighth mask, e.g., the number "8" in FIG. 17 indicates the eighth mask, and then the opening 81 is formed, and the data connection member 73 is exposed.

Next, a pixel electrode PXL is formed. In the present exemplary embodiment, the pixel electrode PXL has a double-layered structure of ITO and silver (Ag). The double layers of ITO and silver (Ag) are wholly stacked, and then a photoresist pattern is formed thereon by using the ninth mask. The pixel electrode PXL is completed by removing the double layers exposed due to the photoresist pattern. The pixel electrode PXL is directly connected with the data connection member 73 that is exposed through the opening 81 in the passivation layer 180.

Next, a partition wall PDL and a spacer SPC are formed. In the present exemplary embodiment, the partition wall PDL is formed first by using a polyimide (PI). In the present exemplary embodiment, the polyimide (PI) is wholly stacked and then the partition wall PDL that surrounds the pixel electrode PXL is completed by using the tenth mask. The partition wall PDL can partition the organic emission layer, and a common electrode may be formed on the organic emission layer and the partition wall PDL.

Next, the spacer SPC is formed. In the present exemplary embodiment, the spacer SPC is formed by using an additional mask (i.e., the eleventh mask) after forming the barrier rub PDL, and may be formed by stacking additional polyimide (PI). However, depending on exemplary embodiments, the partition wall PDL and the spacer SPC may be formed by using one mask, and in this case, a half-tone mask can be used and the spacer SPC may be formed through a half-tone area in the mask.

In the present exemplary embodiment, the partition wall PDL and the spacer SPC are formed by using separate masks because the partition wall PDL and the spacer SPC cannot be formed together by using one mask if a half-tone mask is used since a pixel size is reduced in a high-resolution pixel PX. Thus, two separate masks are used in the exemplary embodiment.

Hereinafter, a structure of the fourth transistor T4 of the pixel PX according to the present exemplary embodiment will be described in detail with reference to FIG. 18.

Figure 18:
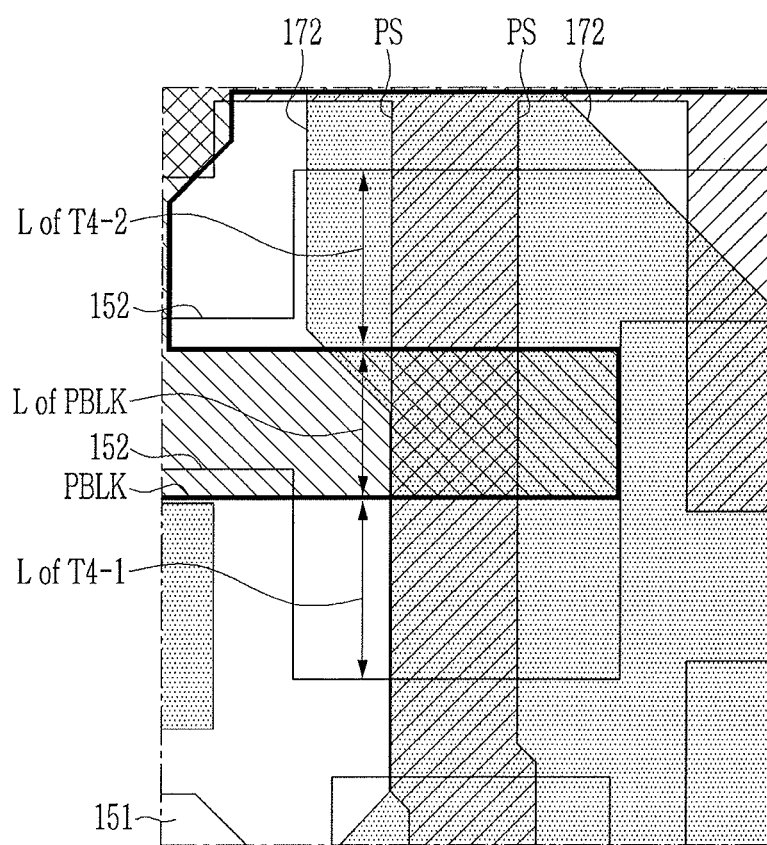
FIG. 18 illustrates an enlarged view of a fourth transistor of a pixel of an organic light emitting diode display according to an exemplary embodiment.

FIG. 18 is an enlarged view of the fourth transistor T4 of the pixel of the organic light emitting diode display according to the exemplary embodiment of FIGS. 1-2.

Referring to FIG. 18, the doping mask PBLK is marked with a bold line. The hatch pattern portion illustrates areas exposed by the doping mask PBLK (i.e., exposed to the P-type impurity). Therefore, portions of the semiconductor layer PS disposed in the hatch pattern portion is doped (i.e., illustrated as crosshatched) and portions of the semiconductor layer PS in other portions (i.e., hatch pattern in a different direction relative to the exposed area of the doping mask PBLK) is not doped.

In such a structure, the entire width of the previous scan line 152 that corresponds to the gate electrode of the fourth transistor T4 is not formed of one transistor but is divided into two transistors T4-1 and T4-2 by a doping area disposed therebetween (i.e., the crosshatched area). In general, a channel is formed in a portion where a wire, e.g., a previous scan line, and a semiconductor layer overlap each other, and a width of the wire needs to be greater than a predetermined width. Thus, when the wire and the semiconductor layer need to overlap in two portions to form two channels, the area is increased. However, in the present exemplary embodiment, a doped area is formed below one wire and channels are formed at opposite sides of the doped area such that an area occupied by two transistors can be reduced. In addition, the fourth transistor T4 is formed of two transistors T4-1 and T4-2 that are serially connected, and accordingly, a leakage current can be reduced.

In addition, even if the doping mask PBLK is misaligned, the size of channels of the fourth transistor T4 is not changed. That is, when the doping mask PBLK is vertically misaligned, a channel length L of the transistor T4-1 and a channel length L of the transistor T4-2 may be changed, but the length of the fourth transistor T4 is not changed since the length of the transistor T4 is the sum of the channel length L of the transistor T4-1 and the channel length L of the transistor T4-2.

Hereinafter, a circuit structure of an organic light emitting diode display according to an exemplary embodiment and operation of signal application will be described with reference to FIG. 19 and FIG. 20.

Figure 20:
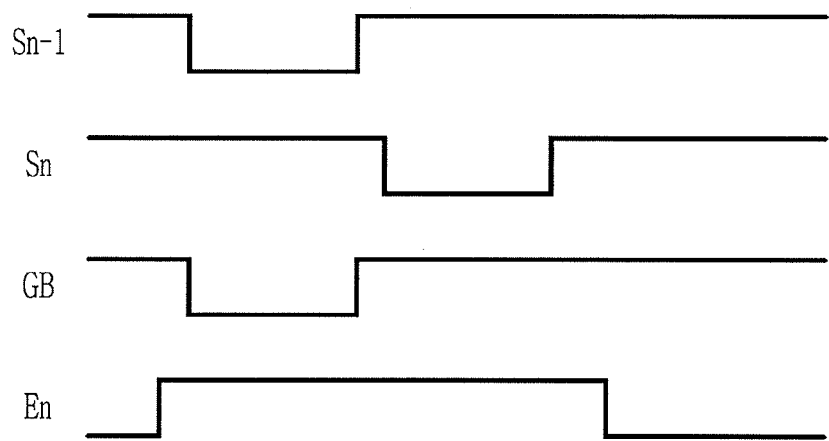
FIG. 20 illustrates a timing diagram of a signal applied to a pixel of an organic light emitting diode display according to an exemplary embodiment.

FIG. 19 is an equivalent circuit diagram of the pixel PX of the organic light emitting diode display according to an exemplary embodiment, and FIG. 20 is a timing diagram of a signal applied to the pixel PX of the organic light emitting diode display according to the exemplary embodiment.

Referring to FIG. 19, the pixel PX of the organic light emitting diode display includes the plurality of transistors T1, T2, T3-1 and T3-2, T4-1 and T4-2, T5, T6, and T7 that are connected to several signal lines 151, 152, 153, 157, 171, 172, and 741, the storage capacitor Cst, and the organic light emitting diode OLED. In addition, shapes and thickness of lines are shown differently to show at what layer each wiring and element of the pixel PX is formed.

In FIG. 19, the semiconductor layer PS is marked with a dotted line, a first conductor GAT1 is marked with a solid line, a second conductor GAT2 is marked with a bold solid line, and a third conductor DAT is marked with a dashed dotted line. The first conductor GAT1 corresponds to the layer of the signal lines 151, 152, 153, and 157, the second conductor GAT2 corresponds to the layer including the sustain line 126, and the third conductor DAT corresponds to the layer including the signal lines 171, 172, and 741.

A portion marked with the bold solid line, which is a portion where the second conductor GAT2 is formed, is a portion of a first storage electrode E1 of the storage capacitor Cst, and portions marked with the dashed dotted lines, which are portions where the third conductor DAT is formed, are the data line 171, the driving voltage line 172, and a wire connected to the organic light emitting diode OLED. The rest of the portions are portions for the semiconductor layer PS and the first conductor GAT1, and a portion including a gate electrode is formed as the first conductor GAT1, while portions corresponding to a channel, a first electrode, and a second electrode of a transistor are formed as the semiconductor layer PS.

The plurality of transistors T1, T2, T3-1, T3-2, T4-1, T4-2, T5, T6, and T7 include the driving transistor T1 and switching transistors connected to the scan line 151, which are the second transistor T2 and third transistors T3-1 and T3-2. The rest of the plurality of transistors are transistors (hereinafter called compensation transistors) that are provided for operation of the organic light emitting diode OLED. The compensation transistors T4-1, T4-2, T5, T6, and T7 may include fourth transistors T4-1 and T4-2, the fifth transistor T5, the sixth transistor T6, and the seventh transistor T7.

The plurality of signal lines 151, 152, 153, 157, 171, 172, and 741 may include the scan line 151, the previous scan line 152, the light emission control line 153, the initialization voltage line 157, the data line 171, the driving voltage line 172, and a common voltage line 741. A line transmitting the bypass signal GB applied to a gate electrode G7 of the seventh transistor T7 may be a part of the previous scan line 152 or may be electrically connected to the previous scan line 152.

The scan line 151 is connected to a gate driver, and transmits a scan signal Sn to the switching transistors, that is, the second transistor T2 and the third transistor T3. The previous scan line 152 is connected with the gate driver, and transmits a previous scan signal Sn-1 applied to a pixel at a previous stage to the fourth transistor T4. The light emission control line 153 is connected to a light emission controller, and transmits a light emission control signal En that controls light emission duration of the organic light emitting diode OLED to the fifth transistor T5 and the sixth transistor T6. The bypass signal GB is transmitted to the gate electrode G7 of the seventh transistor T7, and depending on exemplary embodiments, the same signal as the previous scan signal Sn-1 may be transmitted.

The data line 171 is a wire that transmits the data voltage Dm generated by a data driver, and luminance of the organic light emitting diode OLED (also called an organic light emitting element) is changed depending on the data voltage Dm. The driving voltage line 172 applies the driving voltage ELVDD, the initialization voltage line 157 transmits an initialization voltage Vint that initializes the driving transistor T1, and the common voltage line 741 applies a common voltage ELVSS. The driving voltage line 172, the initialization voltage line 157, and the common voltage line 741 may be respectively applied with constant voltages.

Hereinafter, a plurality of transistors will be described. First, the driving transistor T1 is a transistor that controls intensity of an output current depending on the applied data voltage Dm, and an output driving current $I_d$ is applied to the organic light emitting diode OLED and thus brightness of the organic light emitting diode OLED is controlled according to the data voltage Dm. For this purpose, the first electrode S1 of the driving transistor T1 is located to receive the driving voltage ELVDD, and thus is connected with the driving voltage line 172 via the fifth transistor T5. In addition, the first electrode S1 of the driving transistor T1 is also connected with a second electrode D2 of the second transistor T2 and thus receives the data voltage Dm. The second electrode D1 (i.e., an electrode at an output side) is located to output a current toward the organic light emitting diode OLED, and thus is connected with an anode of the organic light emitting diode OLED via the sixth transistor T6. Meanwhile, the gate electrode G1 is connected with one electrode (i.e., a second storage electrode E2) of the storage capacitor Cst. Thus, a voltage of the gate electrode G1 is changed depending on a voltage stored in the storage capacitor Cst, and accordingly, the driving current $I_d$ output from the driving transistor T1 is changed.

The second transistor T2 is a transistor that receives the data voltage Dm into the pixel PX. A gate electrode G2 is connected with the scan line 151, and a first electrode S2 is connected with the data line 171. A second electrode D2 of the second transistor T2 is connected with the first electrode S1 of the driving transistor T1. When the second transistor T2 is turned on according to the scan signal Sn transmitted through the scan line 151, the data voltage Dm transmitted through the data line 171 is transmitted to the first electrode S1 of the driving transistor T1.

The third transistor T3 is a transistor that causes a compensation voltage (i.e., Dm+Vth), which has been changed from the data voltage Dm while passing through the driving transistor T1 to be transmitted to the second storage electrode E2 of the storage capacitor Cst. The third transistor T3 includes a transistor T3-1 and a transistor T3-2 that are serially connected with each other. Gate electrodes G3-1 and G3-2 of the two transistors T3-1 and T3-2 are all connected with the scan line 151. A first electrode S3-2 of the transistor T3-2 is connected with the second electrode D1 of the driving transistor T1, and a second electrode D3-1 of the transistor T3-1 is connected with the second storage electrode E2 of the storage capacitor Cst and the gate electrode G1 of the driving transistor T1. In addition, a first electrode S3-1 of the transistor T3-1 and a second electrode D3-2 of the transistor T3-2 are connected with each other in a connection portion. When the third transistor T3 is described as a single transistor, the first electrode S3-2 of the transistor T3-2 becomes a first electrode of the third transistor T3 and the second electrode D3-1 of the transistor T3-1 becomes a second electrode of the third transistor T3. The third transistor T3 is turned on according to the scan signal Sn transmitted through the scan line 151 and thus the gate electrode G1 and the second electrode D1 of the driving transistor T1 are connected, and the second electrode D1 of the driving transistor T1 and the second storage electrode E2 of the storage capacitor Cst are connected with each other.

The fourth transistor T4 initializes the gate electrode G1 of the driving transistor T1 and the second storage electrode E2 of the storage capacitor Cst. The fourth transistor T4 includes a transistor T4-1 and a transistor T4-2 that are serially connected with each other. Two gate electrodes G4-1 and G4-2 are connected with the previous scan line 152, and a second electrode D4-2 of the transistor T4-2 is connected with the initialization voltage line 157. A first electrode S4-1 of the transistor T4-1 is connected to the second storage electrode E2 of the storage capacitor Cst and the gate electrode G1 of the driving transistor T1 via the second electrode D3-1 of the transistor T3-1. The fourth transistor T4 transmits the initialization voltage Vint to the gate electrode G1 of the driving transistor T1 and the second storage electrode E2 of the storage capacitor Cst according to the previous scan signal Sn-1 received through the previous scan line 152. Accordingly, the gate voltage of the gate electrode G1 of the driving transistor T1 and the storage capacitor Cst are initialized. The initialization voltage Vint may be a voltage that has a low-voltage value, which can turn on the driving transistor T1.

The fifth transistor T5 transmits the driving voltage ELVDD to the driving transistor T1. A gate electrode G5 is connected with the light emission control line 153 and a first electrode S5 is connected with the driving voltage line 172. A second electrode D5 of the fifth transistor T5 is connected with the first electrode S1 of the driving transistor T1.

The sixth transistor T6 transmits the driving current $I_d$ output from the driving transistor T1 to the organic light emitting diode OLED. A gate electrode G6 is connected with the light emission control line 153, and a first electrode S6 is connected with the second electrode D1 of the driving transistor T1. A second electrode D6 of the sixth transistor T6 is connected with an anode of the organic light emitting diode OLED.

The fifth transistor T5 and the sixth transistor T6 are simultaneously turned on according to the light emission control signal En transmitted through the light emission control line 153, and when the driving voltage ELVDD is applied to the first electrode S1 of the driving transistor T1 through the fifth transistor T5, the driving transistor T1 outputs the driving current $I_d$ according to a voltage (i.e., a voltage of the second storage electrode E2 of the storage capacitor Cst) of the gate electrode G1 of the driving transistor T1. The output driving current $I_d$ is transmitted to the organic light emitting diode OLED through the sixth transistor T6. Thus, a current $I_{oled}$ flows to the organic light emitting diode OLED such that the organic light emitting diode OLED emits light.

The seventh transistor T7 initializes the anode of the organic light emitting diode OLED. The gate electrode G7 is connected with the previous scan line 152, a first electrode S7 is connected with the anode of the organic light emitting diode OLED, and a second electrode D7 is connected with the initialization voltage line 157. When the seventh transistor T7 is turned on according to a bypass signal GB, the initialization voltage Vint is applied to the anode of the organic light emitting diode OLED such that the organic light emitting diode OLED is initialized.

The first storage electrode E1 of the storage capacitor Cst is connected with the driving voltage line 172, and the second storage electrode E2 is connected with the gate electrode G1 of the driving transistor T1, the second electrode D3 of the third transistor T3, and the second electrode D4 of the fourth transistor T4. Accordingly, the second storage electrode E2 determines a voltage of the gate electrode G1 of the driving transistor T1, and receives the data voltage Dm through the second electrode D3 of the third transistor T3 or the initialization voltage Vint through the second electrode D4 of the fourth transistor T4.

In addition, in the exemplary embodiment of FIG. 19, the connection portion in the third transistor T3 overlaps the expansion portion of the driving voltage line 172, and thus signal variation can be reduced and an output voltage of the pixel PX can be stabilized. Meanwhile, the anode of the organic light emitting diode OLED is connected with the second electrode D6 of the sixth transistor T6 and the first electrode S7 of the seventh transistor T7, and a cathode of the organic light emitting diode OLED is connected with the common voltage line 741 that transmits the common voltage ELVSS.

The pixel circuit of the exemplary embodiment of FIG. 19 includes seven transistors T1 to T7 and one capacitor Cst, but this is not restrictive. The number of transistors, the number of capacitors, and a connection between the transistors and the capacitor can be variously modified. Depending on exemplary embodiments, the seventh transistor T7 can be omitted.

Although it is not illustrated, the organic light emitting diode display includes a display area where an image is displayed, and such a pixel PX is aligned in various formats such as a matrix in the display area.

Operation of a pixel of the organic light emitting diode display according to the exemplary embodiment will now be described with reference to FIG. 19 and FIG. 20.

During an initialization period, a low-level previous scan signal Sn-1 is supplied to the pixel PX through the previous scan line 152. Then, the fourth transistor T4 which has received the low-level previous scan signal Sn-1 is turned on, and thus the initialization voltage Vint is applied to the gate electrode G1 of the driving transistor T1 and the second storage electrode E2 of the storage capacitor Cst through the fourth transistor T4. Accordingly, the driving transistor T1 and the storage capacitor Cst are initialized. Since the voltage of the initialization voltage Vint is a low-level voltage, the driving transistor T1 can be turned on.

Meanwhile, during the initialization period, a low-level bypass signal GB is applied to the seventh transistor T7. Thus, the seventh transistor T7 is turned on and the initialization voltage Vint is applied to the anode of the organic light emitting diode OLED through the seventh transistor T7. Accordingly, the anode of the organic light emitting diode OLED is also initialized.

Next, during a data writing period, a low-level scan signal Sn is supplied to the pixel PX through the scan line 151. The second transistor T2 and the third transistor T3 are turned on by the low-level scan signal Sn. When the second transistor T2 is turned on, the data voltage Dm is input to the first electrode S1 of the driving transistor T1 through the second transistor T2.

In addition, during the data writing period, the third transistor T3 is turned on, and accordingly, the second electrode D1 of the driving transistor T1 is electrically connected with the gate electrode G1 and the second storage electrode E2 of the storage capacitor Cst. The gate electrode G1 and the second electrode D1 of the driving transistor T1 are diode-connected. In addition, since the gate electrode G1 of the driving transistor T1 is applied with a low-level voltage (i.e., the initialization voltage Vint) during the initialization period, the driving transistor T1 is in the turned-on state. Accordingly, the data voltage Dm input to the first electrode S1 of the driving transistor T1 is output to the second electrode D1 through the channel of the driving transistor T1, and then stored in the second storage electrode E2 of the storage capacitor Cst through the third transistor T3.

In this case, a voltage applied to the second storage electrode E2 is changed depending on a threshold voltage Vth of the driving transistor T1, and when the data voltage Dm is applied to the first electrode S1 of the driving transistor T1 and the initialization voltage Vint is applied to the gate electrode G1 of the driving transistor T1, a voltage output to the second electrode D1 may be Vgs+Vth. Here, Vgs corresponds to a difference between the voltage at the gate electrode G1 and the voltage at the first electrode S1 of the driving transistor T1, and Vgs may have a value of Dm−Vint. Thus, a voltage output from the second electrode D1 and then stored in the second storage electrode E2 may be Dm−Vint+Vth.

Next, during a light emission period, the light emission control signal En supplied from the light emission control line 153 has a low-level value, and thus the fifth transistor T5 and the sixth transistor T6 are turned on. Accordingly, the driving voltage ELVDD is applied to the first electrode S1 of the driving transistor T1, and the second electrode D1 of the driving transistor is connected with the organic light emitting diode OLED. The driving transistor T1 generates a driving current $I_d$ according to a voltage difference between the voltage of the gate electrode G1 and the voltage (i.e., the driving voltage ELVDD) of the first electrode S1. The driving current $I_d$ of the driving transistor T1 may have a value that is proportional to the square of (Vgs−Vth). Here, Vgs equals a voltage difference at opposite ends of the storage capacitor Cst and Vgs has a value of (Vg−Vs), and thus Vgs has a value of (Dm−Vint+Vth−ELVDD). When a value of (Vgs−Vth) is acquired by subtracting Vth, the driving current $I_d$ has a value of (Dm−Vint−ELVDD). That is, the driving current $I_d$ of the driving transistor T1 has a current that is irrespective of the threshold voltage Vth of the driving transistor T1 as an output.

Therefore, although the driving transistor T1 of each pixel PX has a different threshold voltage Vth due to process variation, the driving transistor T1 can output a constant current, thereby solving a problem of non-uniformity in the transistor characteristics.

In the above-stated calculation, the value of Vth may be slightly greater than zero, or may have a negative value if the transistor is provided as a P-type transistor using a polycrystalline semiconductor. In addition, depending on a direction of voltage calculation, expression of + and − may be changed. However, there is no change in that the driving current $I_d$ which is the output current of the driving transistor T1 can have a value that is independent of the threshold voltage Vth. When the above-stated light emission period is terminated, the initialization period starts again and thus the same operation is repeated from the beginning.

Among the first electrode and the second electrode of each of the plurality of transistors T1, T2, T3, T4, T5, T6, and T7, one may become a source electrode and the other may become a drain electrode depending on a direction of application of a voltage or a current.

Meanwhile, depending on exemplary embodiments, as the seventh transistor T7 initializes the anode of the organic light emitting diode OLED during the initialization period, a small amount of current emitted in a condition that the driving transistor T1 is not substantially turned on can be prevented from flowing toward the organic light emitting diode OLED. In this case, the small amount of current is discharged to a terminal of the initialization voltage Vint through the seventh transistor T7 as a bypass current $I_{bp}$. Accordingly, the organic light emitting diode does not emit unnecessary light, and thus a black grayscale can be more vividly displayed and a contrast ratio can be improved. In such a case, the bypass signal GB may be a signal having different timing than the previous scan signal Sn-1. Depending on exemplary embodiments, the seventh transistor T7 may be omitted.

Figure 21:
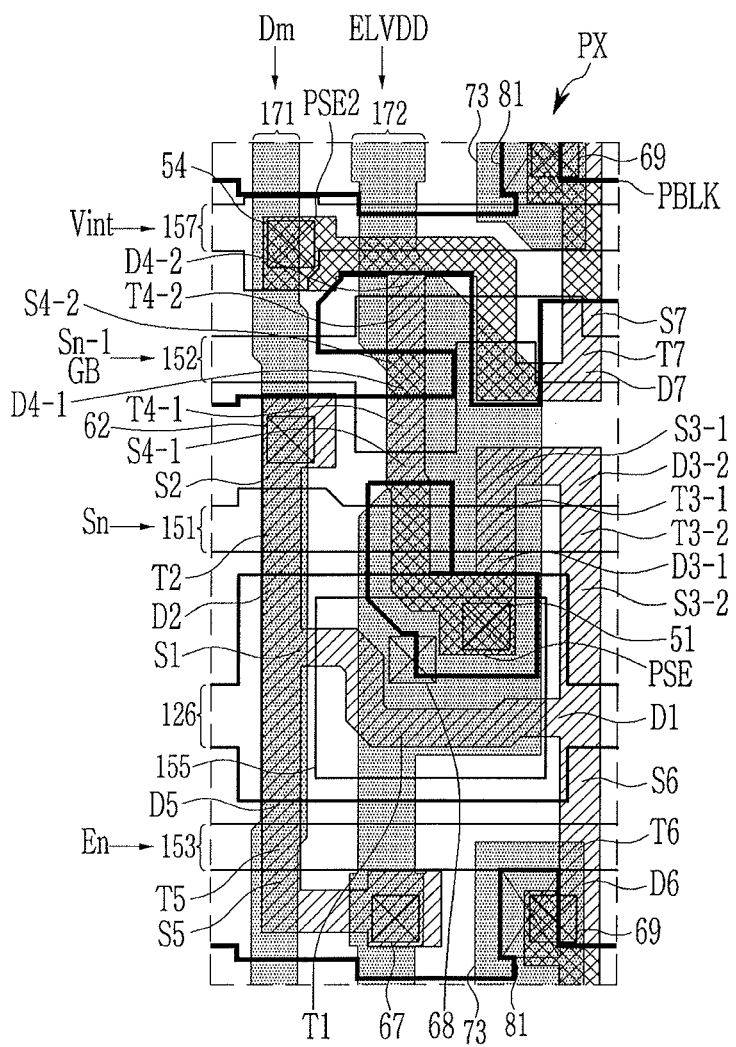
FIG. 21 illustrates a layout view of a pixel area in an organic light emitting diode display according to another exemplary embodiment.

Hereinafter, an exemplary embodiment that is different from the exemplary embodiment of FIG. 1 and FIG. 2 in structure will be described with reference to FIG. 21. FIG. 21 is a layout view of a pixel area in an organic light emitting diode display according to another exemplary embodiment.

Unlike the exemplary embodiment of FIG. 1, in the exemplary embodiment of FIG. 21, a location of the seventh transistor T7 is changed in the semiconductor layer PS. For this purpose, a doping mask PBLK having a structure that is different from the structure of the doping mask PBLK of FIG. 1 is used. To clearly illustrate the doping mask PBLK, unlike FIG. 1, the doping mask PBLK is additionally illustrated in FIG. 21. The doping mask PBLK is illustrated in FIG. 21 to clearly express a difference from FIG. 1 even though it cannot be seen in a completed pixel PX because it is removed after doping.

In the exemplary embodiment of FIG. 21, the doping mask PBLK is different from the doping mask PBLK shown in FIG. 1, and thus doped portions in the semiconductor layer PS are changed. In particular, a doping location at the periphery of the seventh transistor T7 is changed, and accordingly, as shown in FIG. 21, a channel of the seventh transistor T7 is formed far away from a channel of the transistor T4-2.

That is, channels cannot be formed in doped portions of the semiconductor layer PS even though the doped portions overlap the previous scan line 152, and only an undoped portion of the semiconductor layer PS forms the channel of the seventh transistor T7 while being overlapped with the previous scan line 152.

Referring to FIG. 21, the channel of the transistor is formed in an area where a first conductor and an undoped layer of the semiconductor layer PS are overlapped, and thus when a doping mask PBLK that is different from that of the exemplary embodiment of FIG. 1 or FIG. 21 is used, a location where each transistor that forms the pixel PX can be changed. Such an exemplary variation is not limited to FIG. 21, and may have various exemplary variations.

The exemplary embodiment of FIG. 21 also has the same effect as the exemplary embodiment of FIG. 1. That is, the number of contact holes formed in one pixel is reduced such that the size of an area occupied by the pixel can be reduced, and thus can be applied to a high-resolution pixel. In addition, even if two transistors T4-1 and T4-2 are formed by doping some of an area where the gate electrode and the semiconductor layer overlap each other at the periphery of the fourth transistor T4, the size of the pixel PX can be reduced by reducing the size of the area occupied by the pixel PX. In addition, even if the doping mask PBLK is misaligned, the size of channels of the fourth transistor T4 is not changed in such a structure of the fourth transistor T4. Further, expansion portions PSE and PSE2 are added to the semiconductor layer PS, and the expansion portions PSE and PSE2 are directly connected while overlapping a first conductor thereabove such that an area occupied by the pixel PX can be reduced in size.

By way of summation and review, as compared to a liquid crystal display, many constituent elements are included in one pixel of an organic light emitting diode display, and as the number of devices requiring high resolution increase, the size of a pixel becomes smaller, and thus it becomes increasingly difficult to form all the components of the pixel in the corresponding area.

In contrast, exemplary embodiments have been made in an effort to reduce an area occupied by a pixel and to form all constituent elements of every pixel even in the small-sized pixel area. That is, according to the exemplary embodiments, the number of contact holes formed in one pixel can be reduced, thereby reducing an area occupied by the pixel. In addition, the number of openings formed in a pixel can be reduced, thereby reducing an inferiority rate. Meanwhile, an area occupied by a pixel can be reduced by forming a doped portion in an area where a gate electrode and a semiconductor layer overlap each other. Further, an expansion portion is added in the semiconductor layer, and the expansion portion is set to overlap a conductor layer thereabove, thereby reducing the area occupied by the pixel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A manufacturing method of an organic light emitting diode display, comprising:
    forming a semiconductor layer on a substrate;
    forming a doping mask on the semiconductor layer and doping the semiconductor layer;
    removing the doping mask;
    forming a first insulation layer covering the semiconductor layer;
    forming a first conductor on the first insulation layer;
    doping the semiconductor layer by using the first conductor as a mask;
    forming a second insulation layer covering the first conductor;
    forming a second conductor on the second insulation layer;
    forming a third insulation layer covering the second conductor;
    forming a third conductor on the third insulation layer;
    forming a passivation layer covering the third conductor; and
    forming a pixel electrode on the passivation layer.

2. The manufacturing method as claimed in claim 1, wherein
    the forming the semiconductor layer on a substrate comprises forming an amorphous silicon layer by using a first mask, the first mask being different than the doping mask and the first conductor, and
    then crystallizing the amorphous silicon layer into a polycrystalline semiconductor.

3. The manufacturing method as claimed in claim 2, wherein the forming the doping mask on the semiconductor layer and doping the semiconductor layer comprises forming the doping mask by using a second mask, and then doping an exposed semiconductor layer with an impurity.

4. The manufacturing method as claimed in claim 3, wherein in the removing the doping mask, the doping mask is removed by using a stripper.

5. The manufacturing method as claimed in claim 3, wherein the forming the first insulation layer covering the semiconductor layer comprises forming openings at the first insulation layer by using a third mask.

6. The manufacturing method as claimed in claim 5, wherein in the forming the first conductor on the first insulation layer, the first conductor is formed by using a fourth mask.

7. The manufacturing method as claimed in claim 6, wherein the first conductor comprises a scan line, a previous scan line, a light emission control line, a initialization voltage line, and a gate electrode.

8. The manufacturing method as claimed in claim 6, wherein in the forming the second conductor on the second insulation layer, the second conductor is formed by using a fifth mask.

9. The manufacturing method as claimed in claim 8, wherein the second conductor comprises a sustain line including an expansion portion which functions as a first storage electrode.

10. The manufacturing method as claimed in claim 8, wherein
the forming the third insulation layer covering the second conductor comprises
forming openings at the third insulation layer by using a sixth mask.

11. The manufacturing method as claimed in claim 10, wherein the openings formed by the sixth mask comprises an opening also formed in the first insulation layer and the second insulation layer disposed below the third insulation layer.

12. The manufacturing method as claimed in claim 11, wherein
the opening in the first insulation layer, the second insulation layer, and the third insulation layer exposes a portion of the semiconductor layer, and
through the exposed portion of the semiconductor layer, the semiconductor layer receives a data voltage, or a driving voltage, or applies a driving current.

13. The manufacturing method as claimed in claim 10, wherein
the openings formed by the sixth mask comprises an opening formed only in the third insulation layer, and
the opening by the sixth mask exposes an expansion portion of a sustain line which functions as a first storage electrode.

14. The manufacturing method as claimed in claim 10, wherein in the forming the third conductor on the third insulation layer, the third conductor is formed by using a seventh mask.

15. The manufacturing method as claimed in claim 14, wherein the third conductor comprises a data line, a driving voltage line, and a data connection member.

16. The manufacturing method as claimed in claim 14, wherein the forming the passivation layer covering the third conductor comprise forming openings at the passivation layer by using a eighth mask.

17. The manufacturing method as claimed in claim 16, wherein the forming the pixel electrode on the passivation layer comprises forming the pixel electrode by using a ninth mask.

18. The manufacturing method as claimed in claim 1, further comprising:
forming a partition wall surrounding the pixel electrode.

19. The manufacturing method as claimed in claim 1, further comprising:
before the forming the semiconductor layer on the substrate, forming a buffer layer on the substrate.

20. The manufacturing method as claimed in claim 19, further comprising:
before the forming the buffer layer on the substrate, forming a barrier layer on the substrate.

* * * * *